US007741721B2

(12) United States Patent
Black et al.

(10) Patent No.: US 7,741,721 B2
(45) Date of Patent: Jun. 22, 2010

(54) ELECTRICAL FUSES AND RESISTORS HAVING SUBLITHOGRAPHIC DIMENSIONS

(75) Inventors: Charles T. Black, New York, NY (US); Matthew E. Colburn, Hopewell Junction, NY (US); Timothy J. Dalton, Ridgefield, CT (US); Daniel C. Edelstein, White Plains, NY (US); Wai-Kin Li, Beacon, NY (US); Anthony K. Stamper, Williston, VT (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 203 days.

(21) Appl. No.: 11/831,236

(22) Filed: Jul. 31, 2007

(65) Prior Publication Data

US 2009/0032959 A1 Feb. 5, 2009

(51) Int. Cl.
*H01L 23/52* (2006.01)
(52) U.S. Cl. ............... 257/773; 257/784; 257/E23.141; 257/E23.147; 257/E23.149; 257/E21.592
(58) Field of Classification Search .......... 257/784, 257/E23.147, E23.149, E21.592, 773, E23.141
See application file for complete search history.

(56) References Cited

U.S. PATENT DOCUMENTS

2002/0158342 A1* 10/2002 Tuominen et al. .......... 257/784
2002/0189350 A1* 12/2002 Tu .......................... 73/504.04
2006/0175667 A1* 8/2006 Tsuchiaki ................. 257/391
2006/0197157 A1* 9/2006 Koyama et al. ........... 257/351

OTHER PUBLICATIONS

Yang, Haining et al., "Sub-Lithographic Feature Patterning Using Self-Aligned Self-Assembly Polymers", U.S. Appl. No. 11/424,963, filed Jun. 19, 2006.
Nealey, Paul F., "Self-assembling resists for nanolithography", IEDM Technical Digest, Dec. 2005, Digital Object Identifier 10.1109/IEDM.2005.1609349, IEEE.

* cited by examiner

*Primary Examiner*—Zandra Smith
*Assistant Examiner*—Tsz K Chiu
(74) *Attorney, Agent, or Firm*—Scully, Scott, Murphy & Presser, P.C.; Joseph P. Abate, Esq.

(57) ABSTRACT

Electrical fuses and resistors having a sublithographic lateral or vertical dimension are provided. A conductive structure comprising a conductor or a semiconductor is formed on a semiconductor substrate. At least one insulator layer is formed on the conductive structure. A recessed area is formed in the at least one insulator layer. Self-assembling block copolymers are applied into the recessed area and annealed to form a first set of polymer blocks and a second set of polymer blocks. The first set of polymer blocks are etched selective to the second set and the at least one insulator layer. Features having sublithographic dimensions are formed in the at least one insulator layer and/or the conductive structure. Various semiconductor structures having sublithographic dimensions are formed including electrical fuses and resistors.

6 Claims, 26 Drawing Sheets

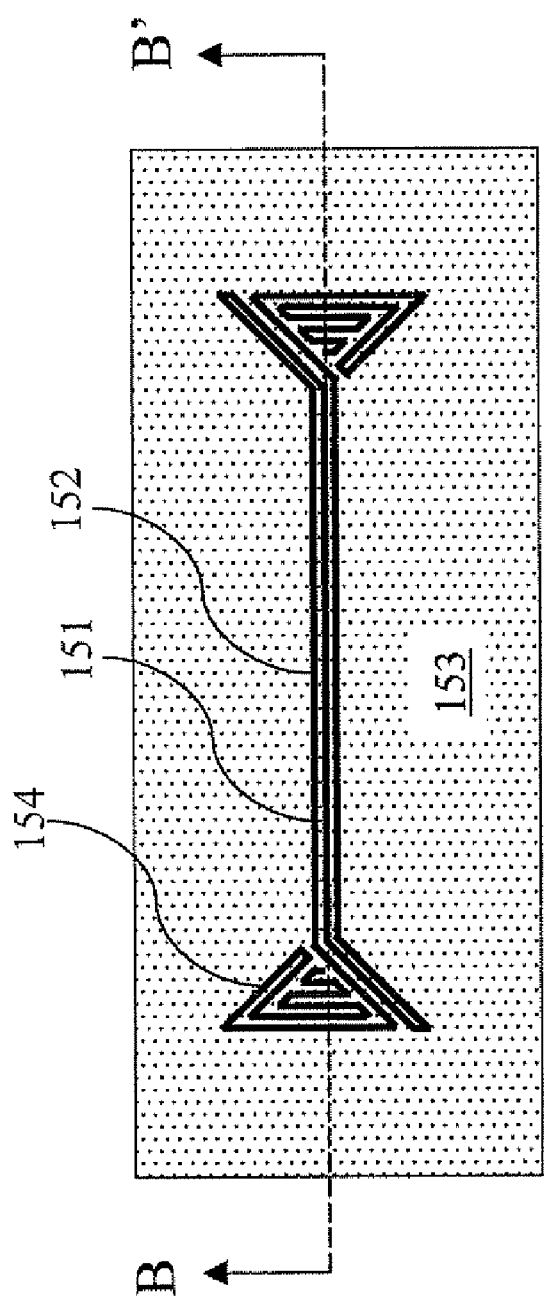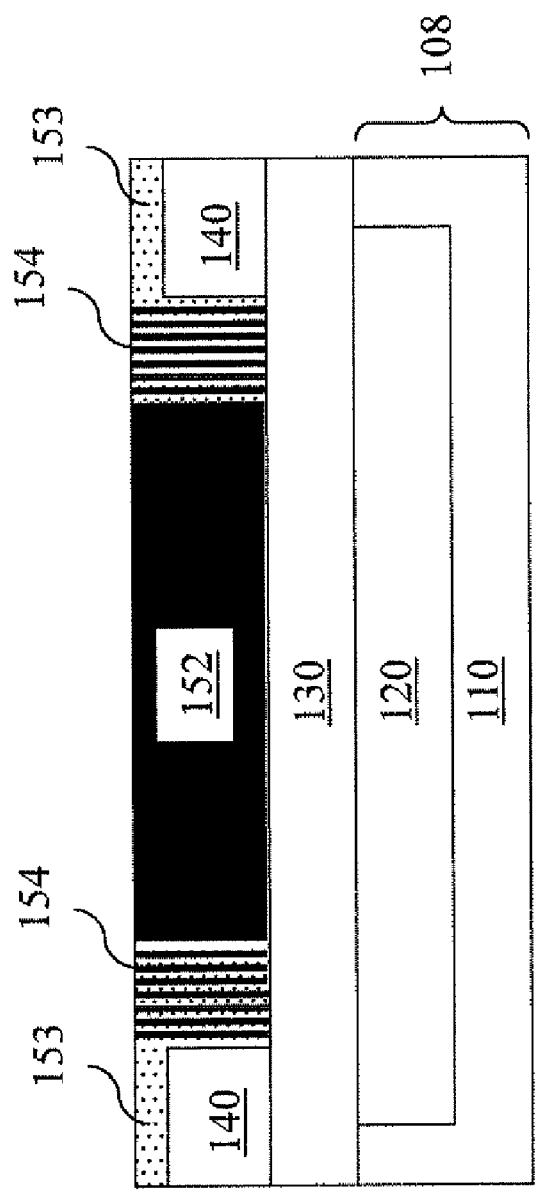

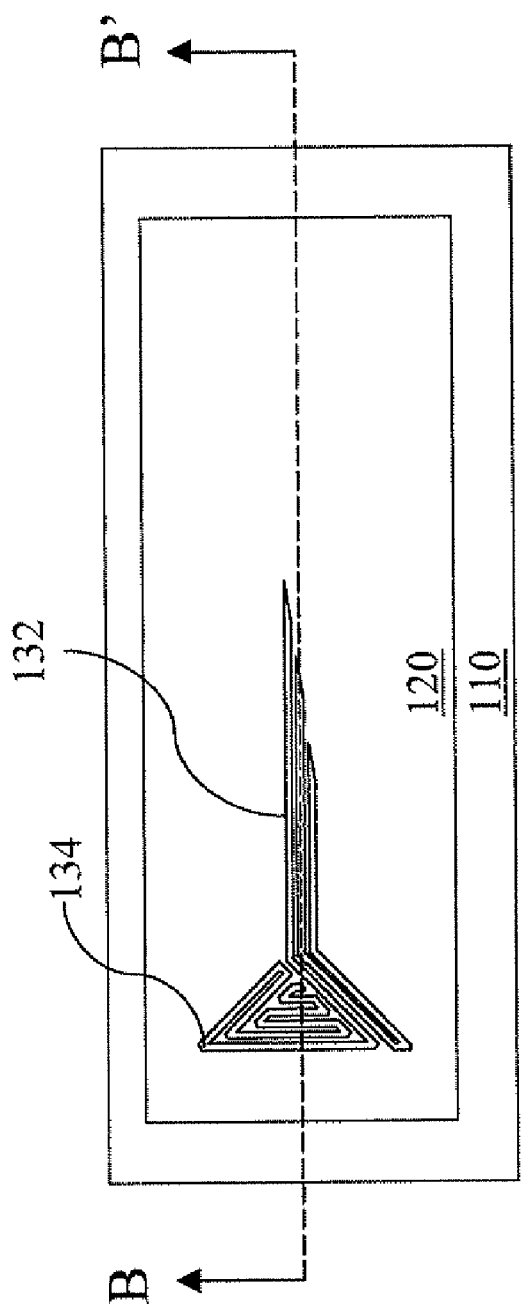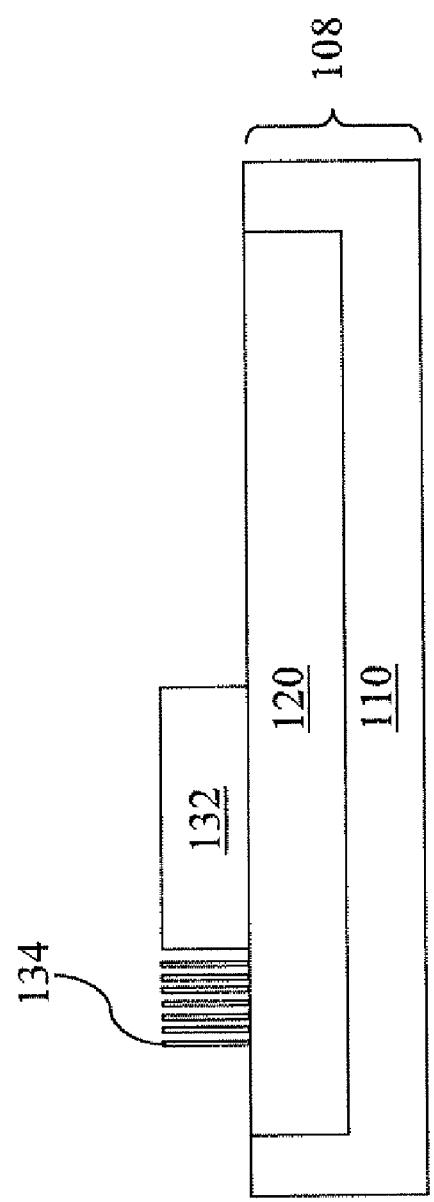

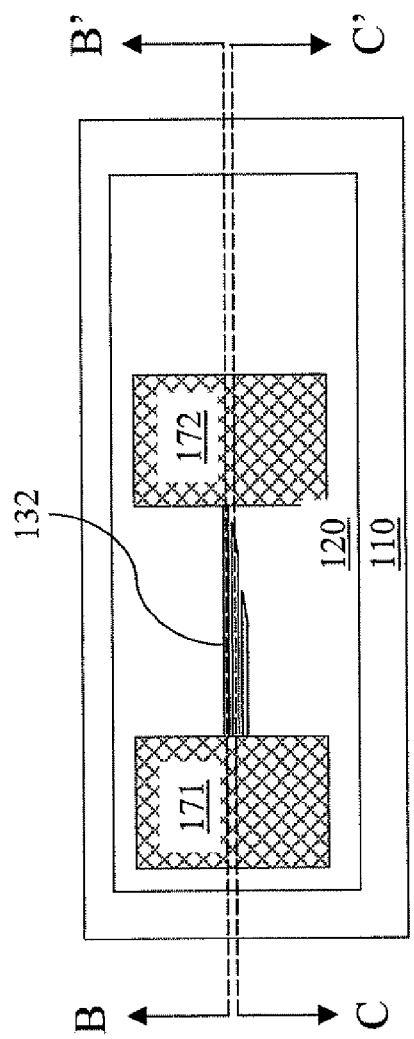
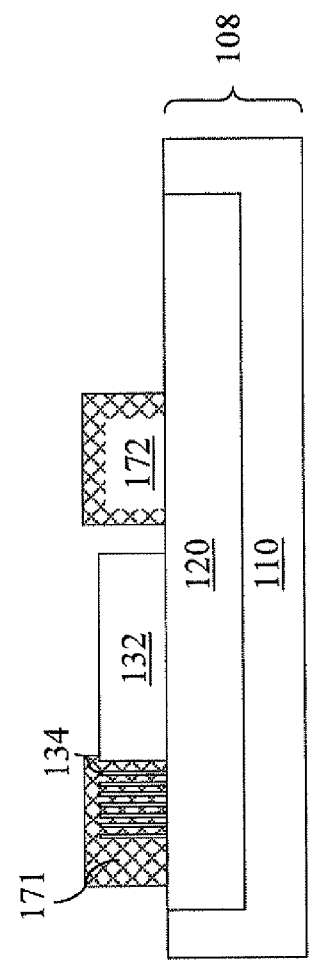
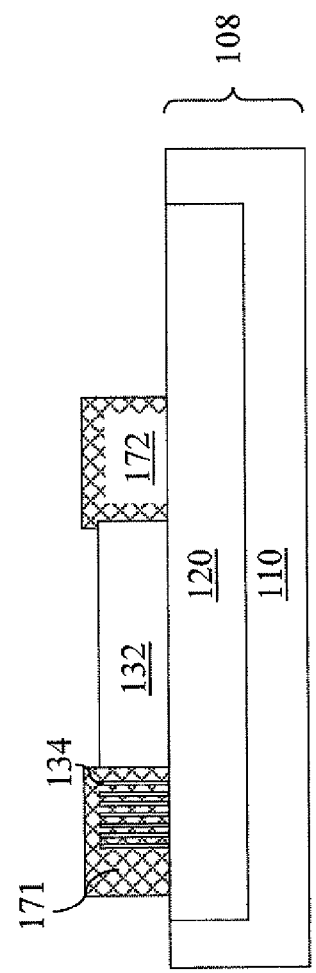
FIG. 7A
FIG. 7B
FIG. 7C

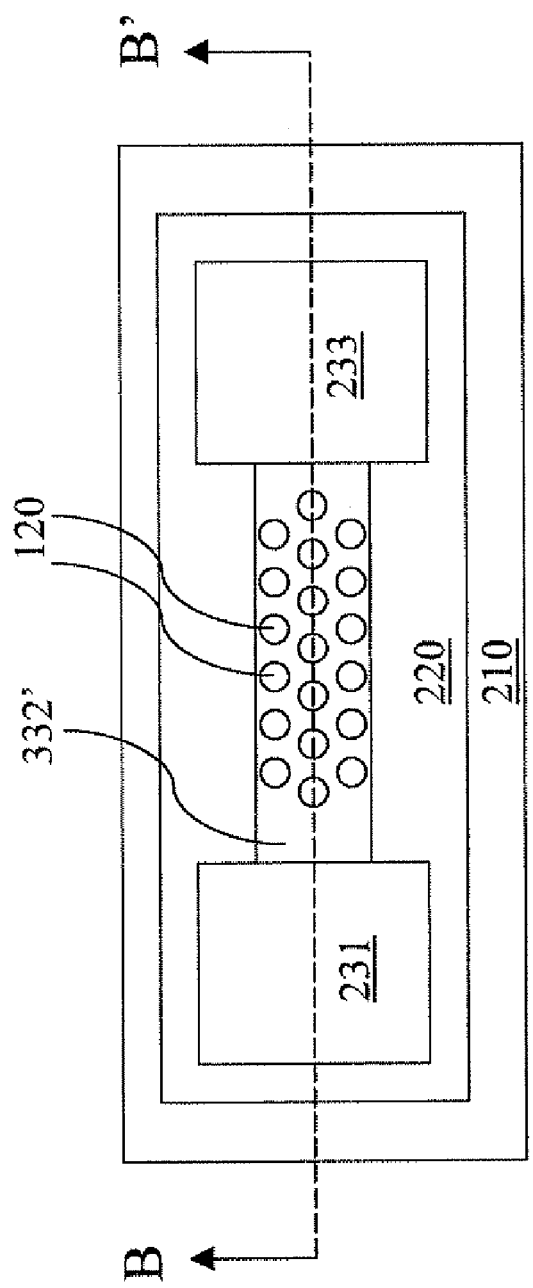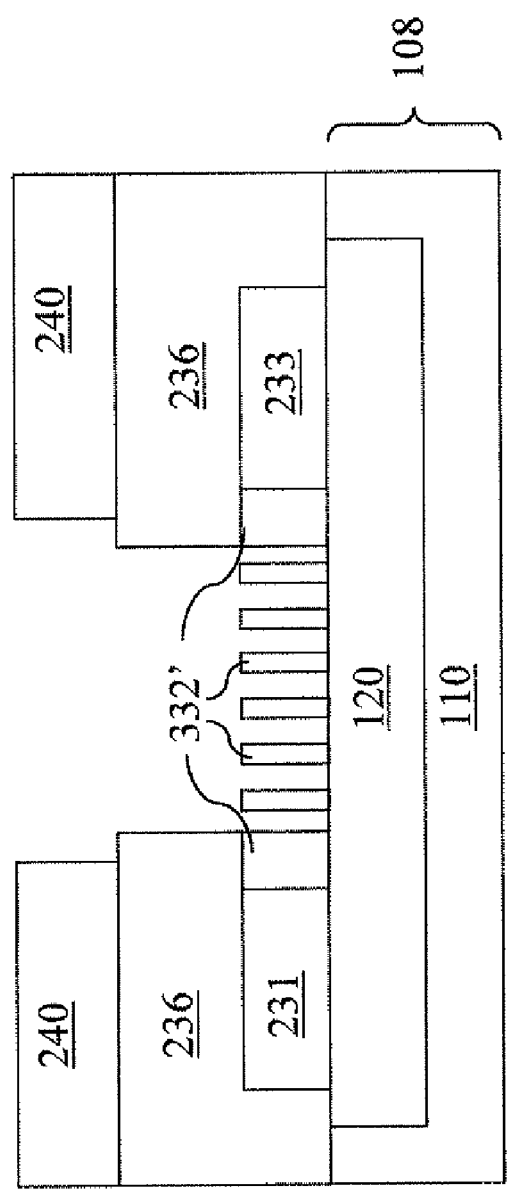

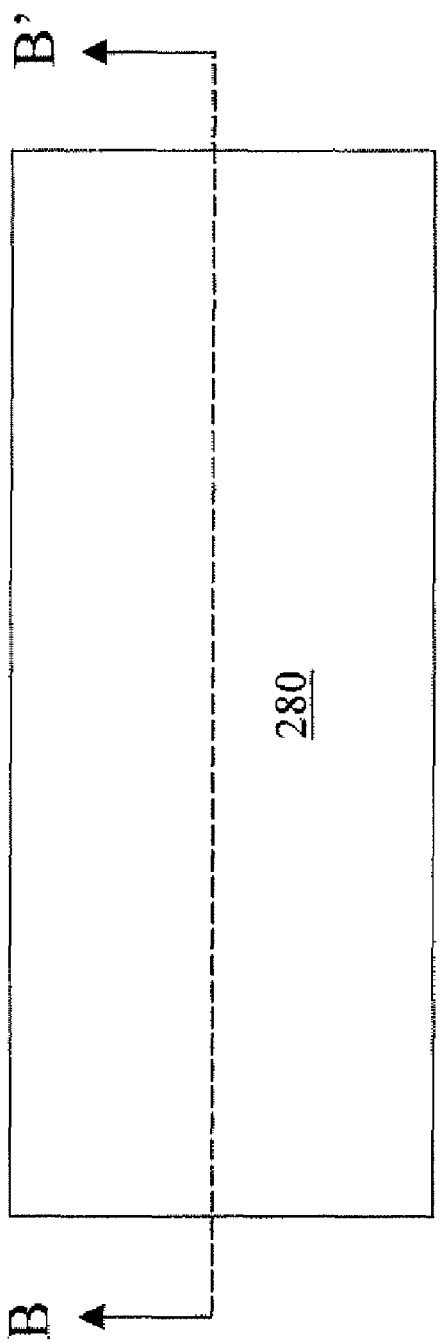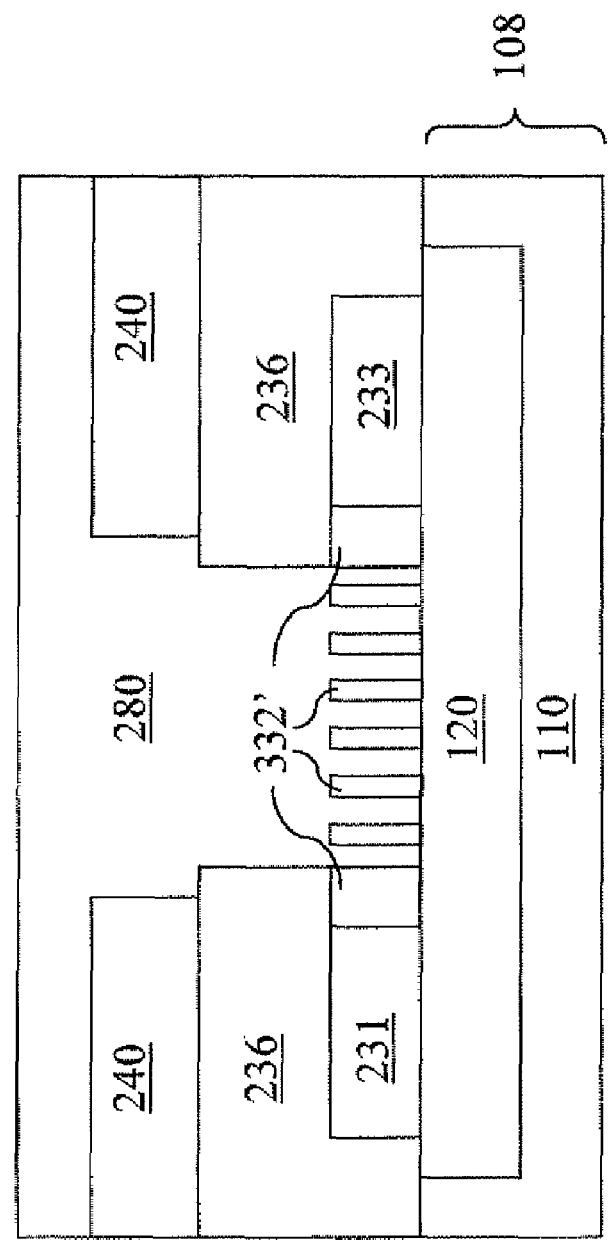

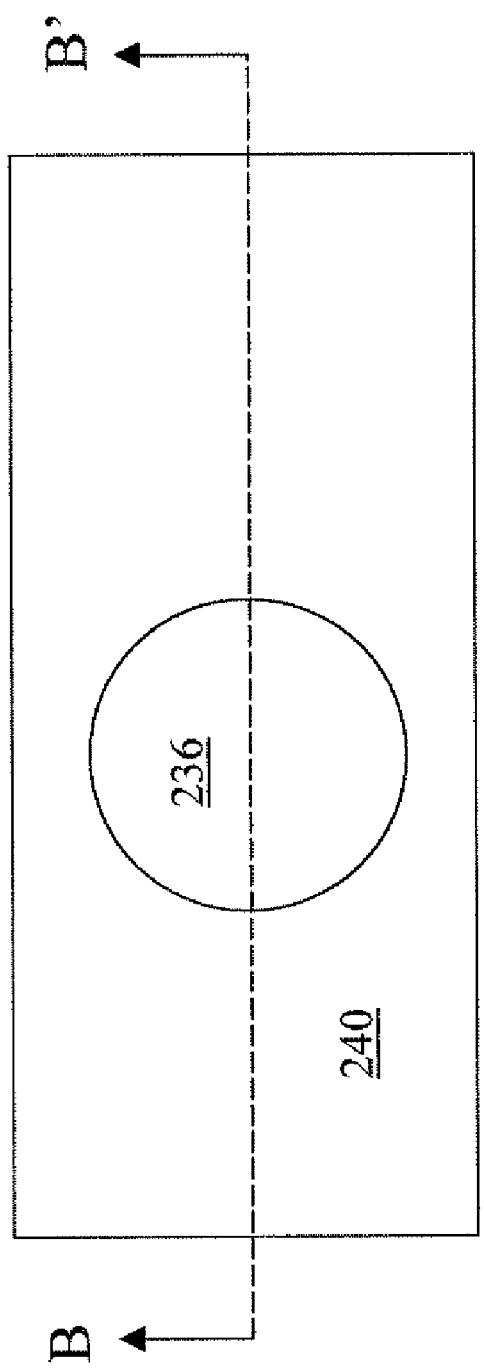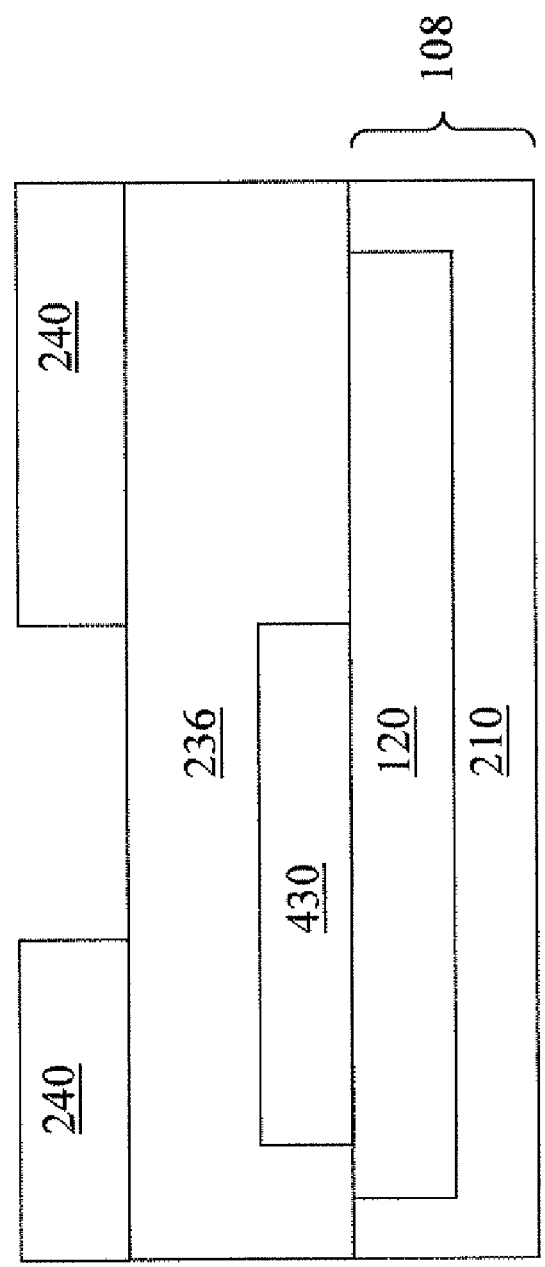

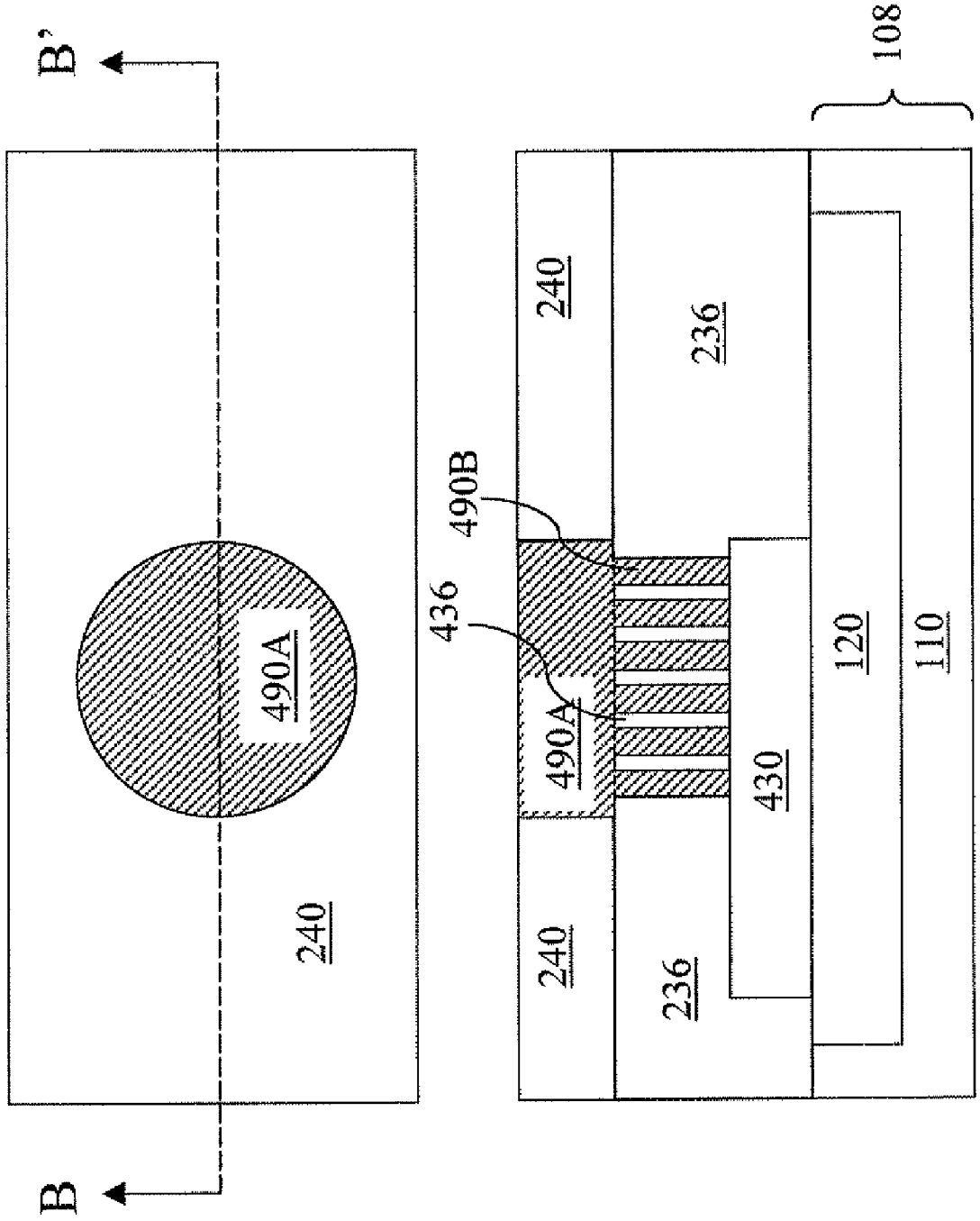

ELECTRICAL FUSES AND RESISTORS HAVING SUBLITHOGRAPHIC DIMENSIONS

FIELD OF THE INVENTION

The present invention relates to semiconductor structures, and particularly to electrical fuses and resistors having sublithographic dimensions and methods of manufacturing the same.

BACKGROUND OF THE INVENTION

Electrical fuses (eFuses) are used in the semiconductor industry to implement array redundancy, field programmable arrays, analog component trimming circuits, and chip identification circuits. Once programmed, the programmed state of an electrical fuse does not revert to the original state on its own, that is, the programmed state of the fuse is not reversible. For this reason, electrical fuses are called One-Time-Programmable (OTP) memory elements.

The mechanism for programming an electrical fuse is electromigration of a metal semiconductor alloy induced by an applied electrical field and a raised temperature on a portion of the electrical fuse structure. The metal semiconductor alloy is electromigrated under these conditions from the portion of the electrical fuse structure, thereby increasing the resistance of the electrical fuse structure. The rate and extent of electromigration during programming of an electrical fuse is dependent on the temperature and the current density at the electromigrated portion.

For scaling of electrical fuses, it is necessary to reduce the size of a programming transistor that applies a programming current to the electrical fuses. However, reliable programming of electrical fuses requires at least a minimum current density above which electromigration of the metal semiconductor alloy is induced. Therefore, it is advantageous to form a portion having a narrow with in an electrical fuse structure.

Dimensions of semiconductor structure are typically limited by a minimum printable dimension of a lithography tool employed to pattern the physical feature of the semiconductor structure. The minimum printable dimension is measured by a critical dimension of the lithography tool, which is defined as the width of narrowest parallel lines or narrowest parallel spaces having a minimum pintable pitch. Thus, a typical electrical fuse has a "fuselink" at which the width of the electrical fuse is a critical dimension, or a "lithographic minimum width" for a given lithography tool. The size of a programming transistor is designed to deliver at least the minimum current density to the fuselink.

While a "lithographic minimum dimension" and a "sublithographic dimension" are defined only in relation to a lithography tool and normally changes from generation to generation of semiconductor technology, it is understood that the lithographic minimum dimension and the sublithographic dimension are to be defined in relation to the best performance of lithography tools available at the time of semiconductor manufacturing. As of 2007, the lithographic minimum dimension is about 50 nm and is expected to shrink in the future.

An electrical fuse having a sublithographic width in the path of the programming current would provide a higher current density for a given programming current than an electrical use having a fuselink with a lithographic minimum width. Thus, less programming current would be necessary to program the electrical fuse having a sublithographic width, and a smaller programming transistor would be required for programming of the electrical fuse.

In view of the above, there exists a need to provide an electrical fuse structure having a sublithographic dimension and methods of manufacturing the same.

Further, most semiconductor circuits require passive components such as resistors. The resistance of a resistor is determined by the resistivity of the material comprising the resistor and the length, width, and the height of the resistor. While formation of a resistor having a sublithographic height may be effected by controlling the thickness of a layer comprising the resistor, formation of sublithographic dimensions in the length and/or the width of a resistor are difficult to achieve.

Therefore, there also exists a need to provide a resistor structure having a sublithographic dimension and methods of manufacturing the same.

SUMMARY OF THE INVENTION

The present invention addresses the needs described above by providing electrical fuses and resistors having a sublithographic dimension which is formed by employing self-aligned self-assembly polymers.

According to an embodiment of the present invention, an elongated groove having a lithographic width is formed in an insulator layer disposed over a semiconductor layer. Self-assembling block copolymers containing two or more different polymeric block components that are immiscible with one another are applied within the elongated groove and annealed to form a first set of parallel polymer block lines containing a first polymeric block component and a second set of parallel polymer block lines containing a second polymeric block component and interspersed with the first set of parallel polymer block lines. Both the first set and the second set of parallel polymer block lines have sublithographic widths, i.e., widths that are less than a critical dimension of a lithography tool. The first set of parallel polymer block lines are etched selective to the second set and the insulator layer. The pattern of sublithographic width lines is transferred into the semiconductor layer forming a parallel semiconductor lines having sublithographic widths. The parallel semiconductor lines are cut at a non-orthogonal angle to provide multiple sublithographic width semiconductor lines having different lengths, which are selectively contacted to provide an electrical fuse that may be programmed with a low programming current or a resistor having a higher resistance per length.

According to another embodiment of the present invention, a semiconductor structure comprising a conductive material and having a first electrode, a second electrode, and a link portion located at the same level is formed, wherein the link portion contains at least one hole having a sublithographic dimension. The first electrode, the second electrode, and the link portion may be an anode, a cathode, and a fuselink, respectively. A stack of insulator layers is formed over the fuselink of the electrical fuse and patterned so that a recessed area is formed in the stack of the insulator layers. Self-assembling block copolymers containing two or more different polymeric block components that are immiscible with one another are applied within the recessed area and annealed. A first set of polymer blocks containing a first polymeric block component and a second set of polymer blocks containing a second polymeric block component are formed. In one case, the first set of polymer blocks forms multiple parallel lines. In another case, the first set of polymer block forms multiple cylinders. The first set of polymer blocks are etched selective to the second set of polymer blocks and the stack of insulator layers. A pattern of multiple parallel lines or multiple holes is transferred into the fuselink. The electrical fuselink thus formed has multiple holes in the fuselink, and as a consequence, a smaller cross-sectional area, thus requiring less programming current than an electrical fuse having the same fuselink width and having no holes in the fuselink. The inventive electrical fuse may be utilized as a resistor as well.

According to yet another embodiment of the present invention, an electrical fuse having multiple sublithographic vertical cylindrical links is formed. A bottom conductive plate is formed on a semiconductor substrate and a stack of insulator layers is formed thereupon. A recessed area is formed in the stack of the insulator layers and patterned so that a recessed area is formed at least over a portion of the bottom conductive plate. Self-assembling block copolymers containing two or more different polymeric block components that are immiscible with one another are applied within the recessed area and annealed. A first set of polymer blocks containing a first polymeric block component and a second set of polymer blocks containing a second polymeric block component are formed. The first set of polymer block forms multiple cylinders. The first set of polymer blocks are etched selective to the second set of polymer blocks and the stack of insulator layers. A pattern of multiple circles is transferred through the stack of the insulator layers down to a top surface of the bottom plate to form substantially cylindrical via holes having sublithographic diameters by a reactive ion etching. A conductive material is formed within the sublithographic cylindrical via holes and in the recessed area to form multiple sublithographic vertical cylindrical links and a top conductive plate. By passing current through the sublithographic vertical cylindrical links, the inventive electrical fuse may be programmed. The inventive electrical fuse may be utilized as a resistor as well.

According to an aspect of the present invention, a semiconductor structure is provided, which comprises:

a plurality of parallel conductive lines having a width of a first sublithographic dimension and located on a semiconductor substrate, wherein each adjacent pair of the parallel conductive lines is separated by a second sublithographic dimension;

a first electrode contacting all of the plurality of parallel conductive lines; and a second electrode contacting at least one but not all of the plurality of parallel conductive lines.

In one embodiment, the plurality of parallel conductive lines comprises a semiconductor material.

In another embodiment, the plurality of parallel conductive lines comprises a metal or a metal semiconductor alloy.

In yet another embodiment, edges of the plurality of parallel conductive lines are located substantially on the same line located at a non-orthogonal angle from the direction of the parallel conductive lines. The non-orthogonal angle is greater than 0 degree and may be less than 60 degrees, preferably less than 30 degrees, more preferably less than 15 degrees, and most preferably less than 10 degrees.

In still another embodiment, the second electrode contacts only one of the plurality of parallel conductive lines.

In a further embodiment, the semiconductor structure further comprises a shallow trench isolation, wherein the entirety of bottom surfaces of the plurality of parallel conductive lines, the first electrode, and the second electrode abut a top surface of the shallow trench isolation.

According to another aspect of the present invention, a semiconductor structure is provided, which comprises:

a first electrode comprising a conductive material and located at a level on a semiconductor substrate;

a second electrode disjoined from the first electrode and comprising the conductive material and located at the level on the semiconductor substrate; and a link portion laterally abutting the first electrode and the second electrode and comprising the conductive material and located at the level on the semiconductor substrate and comprising at least one hole having a sublithographic dimension.

In one embodiment, the at least one hole is at least one rectangular hole having a sublithographic width in the direction perpendicular to the direction connecting the first electrode and the second electrode.

In another embodiment, the at least one rectangular hole is a plurality of rectangular holes having a sublithographic width in the direction perpendicular to the direction connecting the first electrode and the second electrode.

In yet another embodiment, the plurality of rectangular holes have a sublithographic spacing between each adjacent pair of rectangular holes.

In still another embodiment, the at least one hole is at least one cylindrical hole having a sublithographic diameter.

In a further embodiment, the at least one cylindrical hole is a plurality of cylindrical holes arranged in a honeycomb pattern.

In further another embodiment, a distance between centers of adjacent cylindrical holes is sublithographic.

In yet further another embodiment, the first electrode, the second electrode, and the link portion comprises a material selected from the group consisting of a semiconductor material, a metal, and a metal semiconductor alloy.

According to a further aspect of the present invention, a semiconductor structure is provided, which comprises:

a bottom conductive plate located at a level on a semiconductor substrate;

a top conductive plate disjoined from the bottom conductive plate and located at another level on the semiconductor substrate, wherein the level and the another level are different; and a plurality of sublithographic vertical cylindrical links comprising the same material as the top conductive plate and vertically abutting the bottom plate and the top plate.

In one embodiment, the plurality of sublithographic vertical cylindrical links is arranged in a honeycomb pattern.

In another embodiment, a distance between centers of adjacent sublithographic vertical cylindrical links is sublithographic.

In yet another embodiment, each of the bottom conductive plate, the top conductive plate, and the plurality of sublithographic vertical cylindrical links comprises a material selected from the group consisting of a semiconductor material, a metal, and a metal semiconductor alloy.

In still another embodiment, the semiconductor structure further comprises:

a dielectric layer vertically embedding the plurality of sublithographic vertical cylindrical links and vertically abutting the bottom conductive plate and the top conductive plate; and a shallow trench isolation vertically abutting a bottom surface of the bottom plate.

In a further embodiment, the semiconductor structure further comprises another dielectric layer vertically abutting the dielectric layer and laterally embedding the top plate, wherein a top surface of the another dielectric layer is coplanar with a top surface of the another dielectric layer.

BRIEF DESCRIPTION OF THE DRAWINGS

FIGS. 1A-7C are sequential views of a first exemplary structure according to a first embodiment of the present invention. Among FIGS. 1A-7B, figures with the same numeric label correspond to the same stage of manufacturing; figures with the suffix "A" are top-down views; figures with the suffix "B" are vertical cross-sectional views along the plane B-B' of the corresponding figure with the same numeric label and the suffix "A." FIG. 7C is a vertical cross-sectional view along the plane C-C' of FIG. 7A.

FIGS. 16A-19B are sequential views of a fourth exemplary structure according to the second embodiment of the present invention. The same figure labeling conventions apply as FIGS. 1A-7B.

FIGS. 20A-26B are sequential views of a fifth exemplary structure according to a third embodiment of the present invention. The same figure labeling conventions apply as FIGS. 1A-7B.

DETAILED DESCRIPTION OF THE INVENTION

Figure 1A:
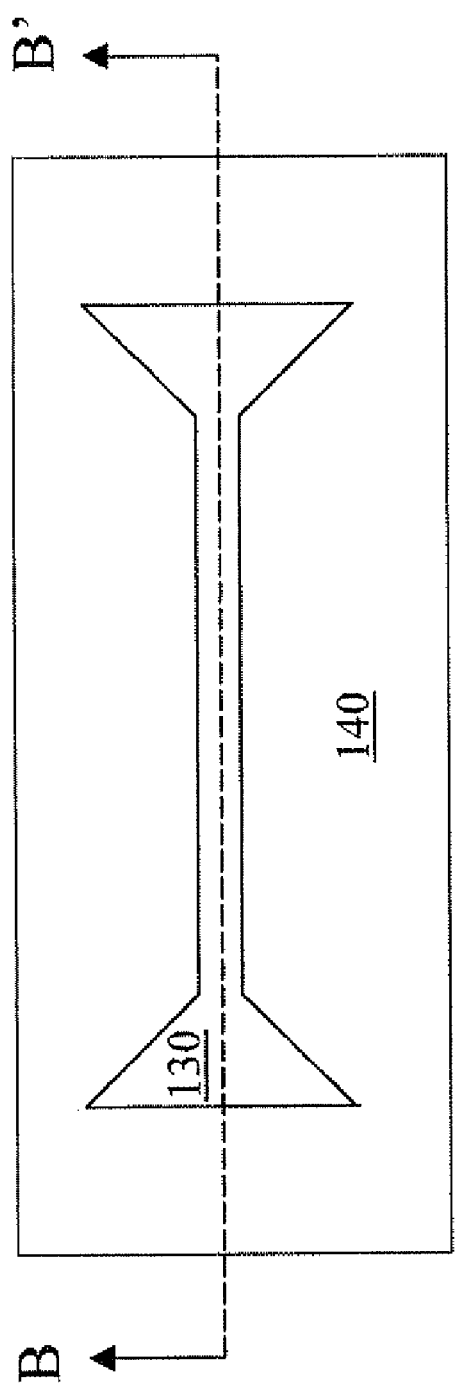

As stated above, the present invention relates to electrical fuses and resistors having sublithographic dimensions and methods of manufacturing the same, which are now described in detail with accompanying figures. It is noted that like and corresponding elements are referred to by like reference numerals.

Figure 1B:
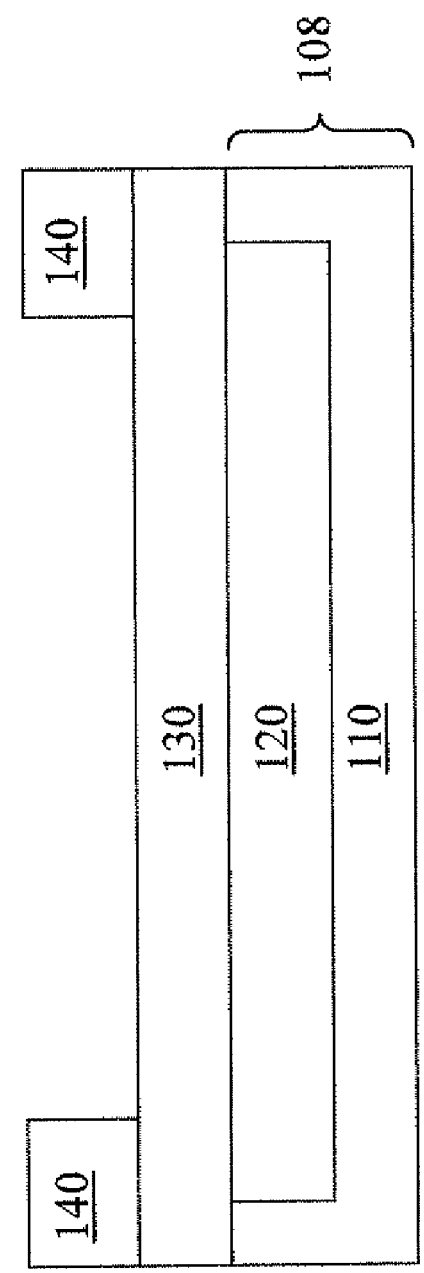

Referring to FIGS. 1A and 1B, a first exemplary structure according to the present invention is shown, which comprises a semiconductor substrate 108 containing a substrate layer 110 and a shallow trench isolation 120 comprising a dielectric material. The semiconductor substrate 8 may be a bulk substrate, a semiconductor-on-insulator (SOI) substrate, or a hybrid substrate. The semiconductor substrate 8 may have a built-in biaxial stress in the plane of the semiconductor substrate 8, i.e., in the direction of the surface normal of the top surface of the semiconductor substrate 8. While the present invention is described with a bulk substrate, implementation of the present invention on an SOI substrate or on a hybrid substrate is explicitly contemplated herein.

A conductive layer 130 is formed on a top surface of the semiconductor substrate 108. The conductive layer 130 may comprise a semiconductor material that may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material may be doped with electrical dopants, or undoped. Alternatively, the conductive layer may comprise a metal or a metal semiconductor alloy such as a metal silicide. The thickness of the conductor 130 depending on the application and may be from about 10 nm to about 300 nm, although lesser and greater thicknesses are also contemplated.

A dielectric layer 140 is formed on the conductive layer 130. The dielectric layer 130 comprises a dielectric material such as an oxide or a nitride. For example, the dielectric layer 130 may comprise silicon oxide. The dielectric layer 140 has a thickness from about 30 nm to about 300 nm. The dielectric layer 140 is patterned to form a recessed area having an elongated groove and two end pad areas. The two end pad areas may be elliptical or polygonal. For example, the two end pads may be trapezoidal in which the shorter edge of a pair of parallel edges abut the elongated groove. The elongated groove is substantially rectangular having a length that is greater than the width. The width of the elongated groove may be a lithographical minimum dimension, i.e., a critical dimension, or may be greater than the lithographical minimum dimension.

Figure 2A:
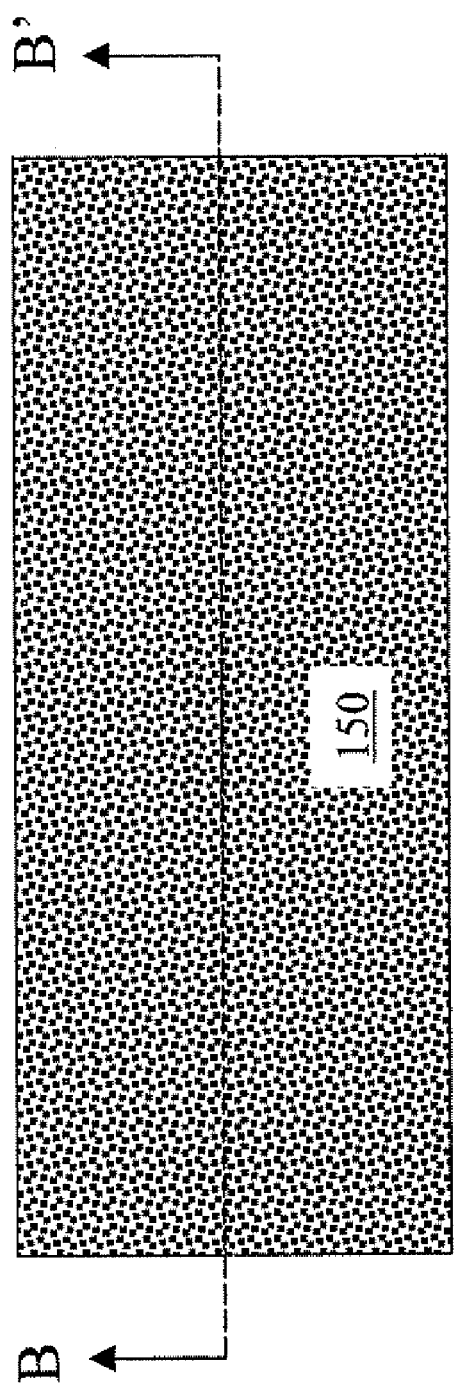
Figure 2B:
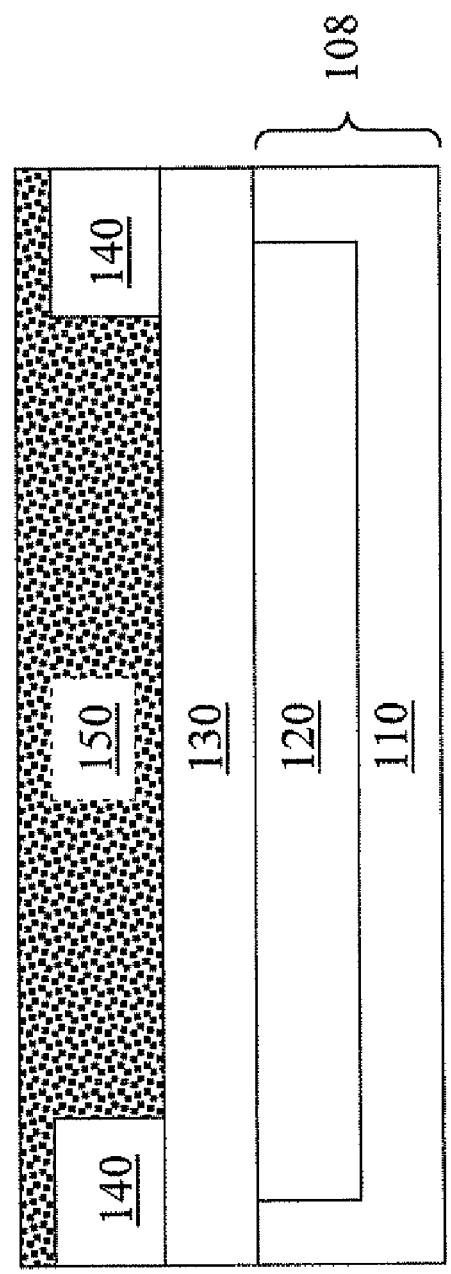

Referring to FIGS. 2A and 2B, a block copolymer layer 150 comprising self-assembling block copolymers that are capable of self-organizing into nanometer-scale patterns are applied over the first exemplary structure including the recessed area. Under suitable conditions, the two or more immiscible polymeric block components separate into two or more different phases on a nanometer scale and thereby form ordered patterns of isolated nano-sized structural units. Such ordered patterns of isolated nano-sized structural units formed by the self-assembling block copolymers can be used for fabricating nano-scale structural units in semiconductor, optical, and magnetic devices. Specifically, dimensions of the structural units so formed are typically in the range of 10 to 40 nm, which are sub-lithographic (i.e., below the resolutions of the lithographic tools).

Exemplary materials for the block copolymer layer 150 are described in commonly-assigned, copending U.S. patent application Ser. Nos. 11/424,963, filed on Jun. 19, 2006, the contents of which are incorporated herein by reference. Specific examples of self-assembling block copolymers that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). The self-assembling block copolymers are first dissolved in a suitable solvent system to form a block copolymer solution, which is then applied onto the surface of the first exemplary structure to form a block copolymer layer 150. The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), and acetone.

Referring to FIGS. 3A and 3B, the first exemplary semiconductor structure is annealed at an elevated temperature to form a first set 151 of parallel polymer block lines containing a first polymeric block component and a second set 152 of parallel polymer block lines containing a second polymeric block component within the elongated groove. The second set 152 of parallel polymer block lines are interspersed with the first set 151 of parallel polymer block lines. Further, pad area polymer block mazes 154 containing a second polymeric block component are formed in the pad areas. A first polymer block region 153 containing the first polymeric block component may be formed outside the recessed area. Exemplary processes of annealing the self-assembling block copolymers in the block copolymer layer 150 to form two sets of polymer blocks are described in Nealey et al., "Self-assembling resists for nanolithography," IEDM Technical Digest, December, 2005, Digital Object Identifier 10.1109/IEDM.2005.1609349, the contents of which are incorporated herein by reference. Further, methods of annealing described in the '963 application may be employed. The anneal may be performed, for example, at a temperature from about 200° C. to about 300° C. for a duration from less than about 1 hour to about 100 hours.

The presence of the elongated groove within the recessed area facilitates formation of the parallel polymer block lines in the first set 151 of parallel polymer block lines and in the second set 152 of parallel polymer block lines. The width of each of the first set 151 of parallel polymer block lines is sublithographic, i.e., smaller than a minimum dimension achievable in normal photolithographic methods, and may be the same amongst the first set 151 of parallel polymer block lines. Also, the width of each of the second set 151 of parallel polymer block lines is sublithographic, and may be the same amongst the second set 152 of parallel polymer block lines. Further, the pitch between an adjacent pair of the parallel polymer block lines among the second set 151 of parallel polymer block lines may also be sub litho graphic.

The portions containing the first polymeric block component, i.e., the first set 151 of parallel polymer block lines and the first polymer block region 153, are removed by a reactive ion etch selective to the portions containing the second polymeric block component, i.e., the second set 152 of parallel polymer block lines and the pad area polymer block mazes 154. Structures comprising the second polymeric block component remain on the conductive layer 130. The dielectric layer 140 may be removed at this processing step.

Figure 4A:
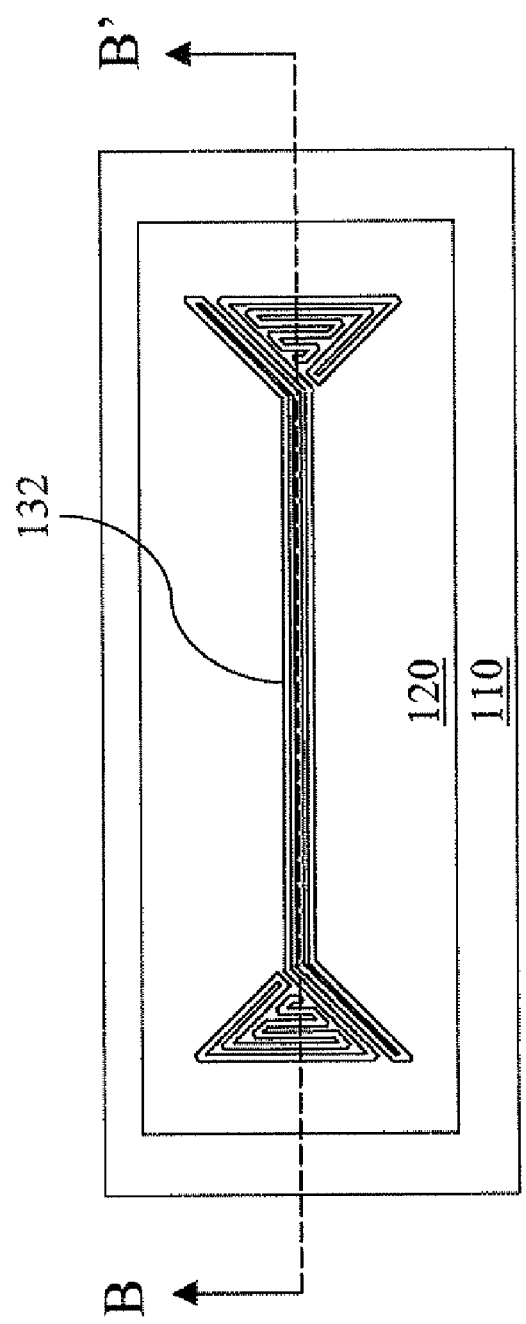
Figure 4B:
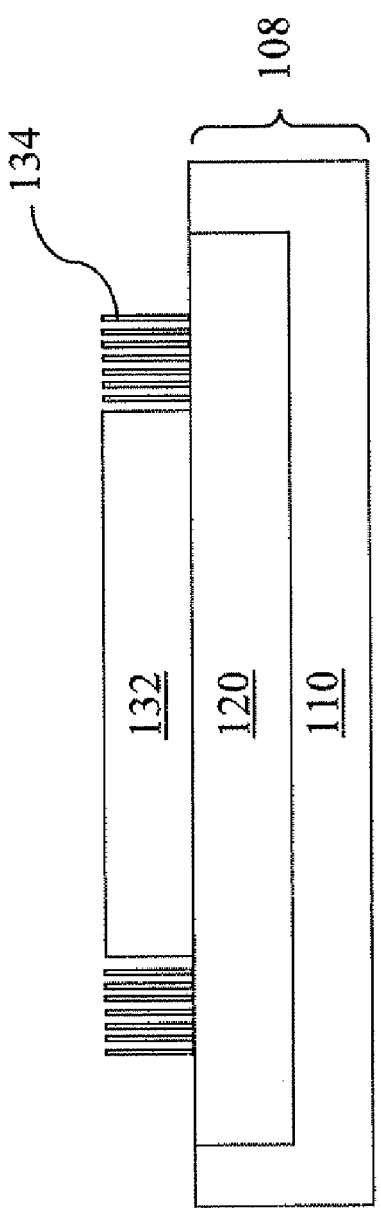

Referring to FIGS. 4A and 4B, the pattern formed by the second set 152 of parallel polymer block lines and the pad area polymer block mazes 154 is transferred by a reactive ion etch into the conductive layer 130 to form a plurality of parallel conductive lines 132 underneath the second set 152 of parallel polymer block lines and pad area conductive line mazes 134 underneath the pad area polymer block mazes 154. Each of the plurality of parallel conductive lines 132 has a line width, which is a first sublithographic dimension. Further, each adjacent pair of the parallel conductive lines 132 is separated by a pitch, which is a second sublithographic dimension. The reactive ion etch is performed down to a top surface of the shallow trench isolation 120. After the reactive ion etch, the second set 152 of parallel polymer block lines and pad area polymer block mazes 154 are removed.

Figure 5A:
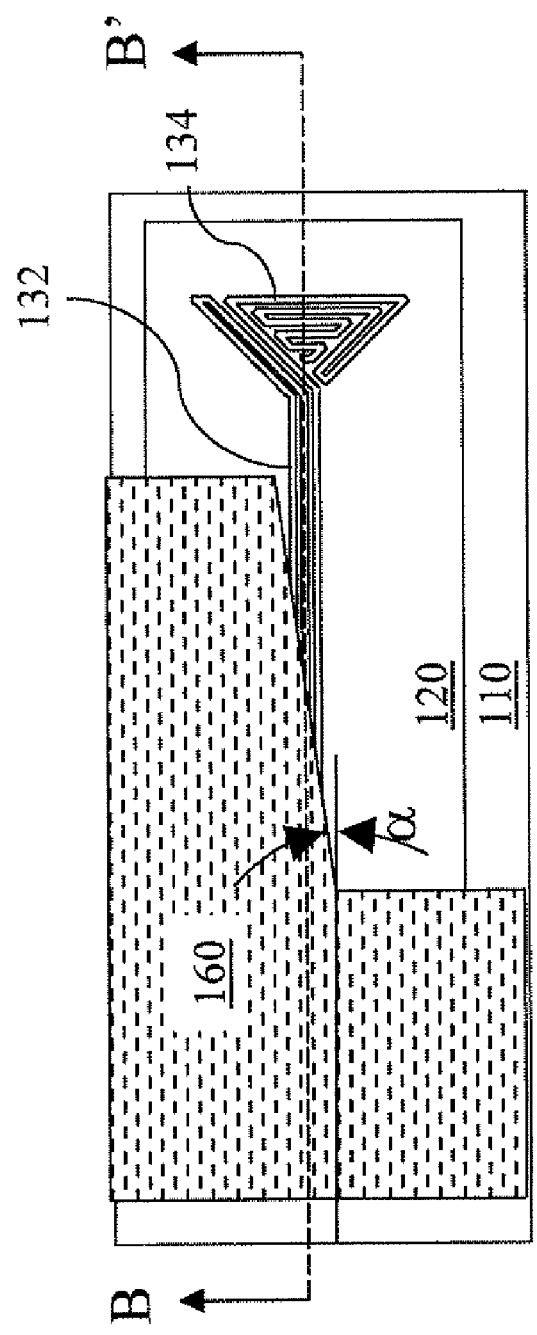
Figure 5B:
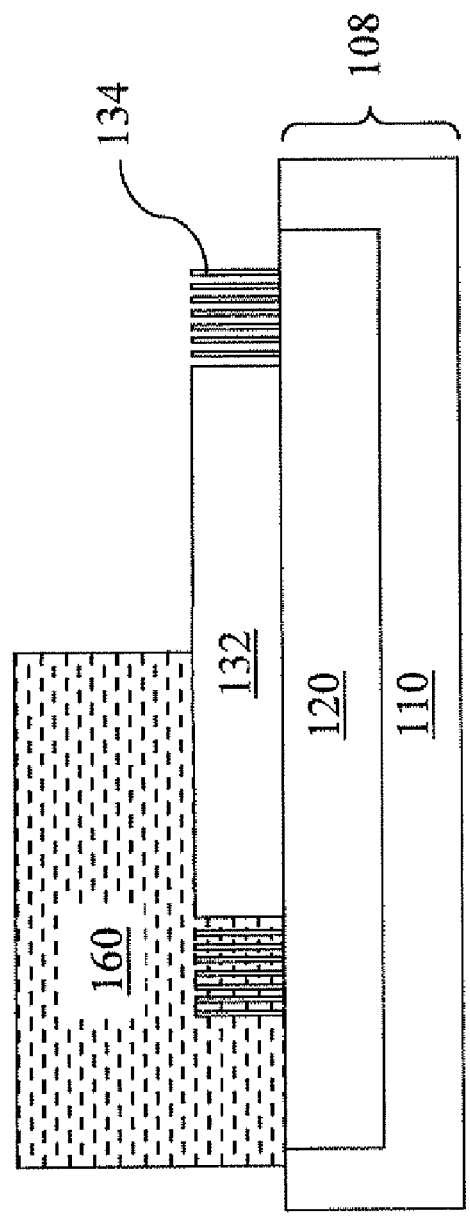

Referring to FIGS. 5A and 5B, a photoresist 160 is applied over the pattern of the parallel conductive lines 132 and the pad area conductive line mazes 134 and lithographically patterned to expose one of the two pad areas and portions of the parallel conductive lines 132. Specifically, an edge of the photoresist 160 crosses the plurality of parallel conductive lines 132 at a non-orthogonal angle α from the direction of the parallel conductive lines 132. The non-orthogonal angle α is greater than 0 degree and may be less than 60 degrees, preferably less than 30 degrees, more preferably less than 15 degrees, and most preferably less than 10 degrees.

Referring to FIGS. 6A and 6B, the exposed portions of the parallel conductive lines 132 and one of the pad area conductive line mazes 134 are removed by a reactive ion etch which is preferably selective to the shallow trench isolation 120. The remaining portion of the photoresist 160 is removed. The remaining portions of the parallel conductive lines 132 have different lengths, in which the length increases linearly from one line to the next across the parallel conductive lines 132.

Referring to FIGS. 7A and 7C, a first electrode 171 and a second electrode 172 comprising a conductive material is formed. Preferably, the first electrode 171 contacts all of the plurality of parallel conductive lines 32 and the pad area conductive line maze 134. The second electrode 172 contacts at least one but not all of the plurality of parallel conductive lines 132.

The first exemplary structure comprises a plurality of parallel conductive lines 132 having a width of a first sublithographic dimension and located on a semiconductor substrate 108, wherein each adjacent pair of the parallel conductive lines 132 is separated by a second sublithographic dimension. Further, each of the parallel conductive lines 132 has an edge coinciding with a straight line that has a non-orthogonal angle α with respect to the direction of the parallel conductive lines, and as a consequence, monotonically and linearly changing lengths across the parallel conductive lines 132. In one case, only one of the parallel conductive lines may be contacted by the second electrode 172.

The sublithographic width of the parallel conductive lines 132 may be advantageously employed in an electrical fuse that programs at a lower programming current or a resistor having a higher resistance than electrical fuses or resistors available through the prior art.

Figure 8:
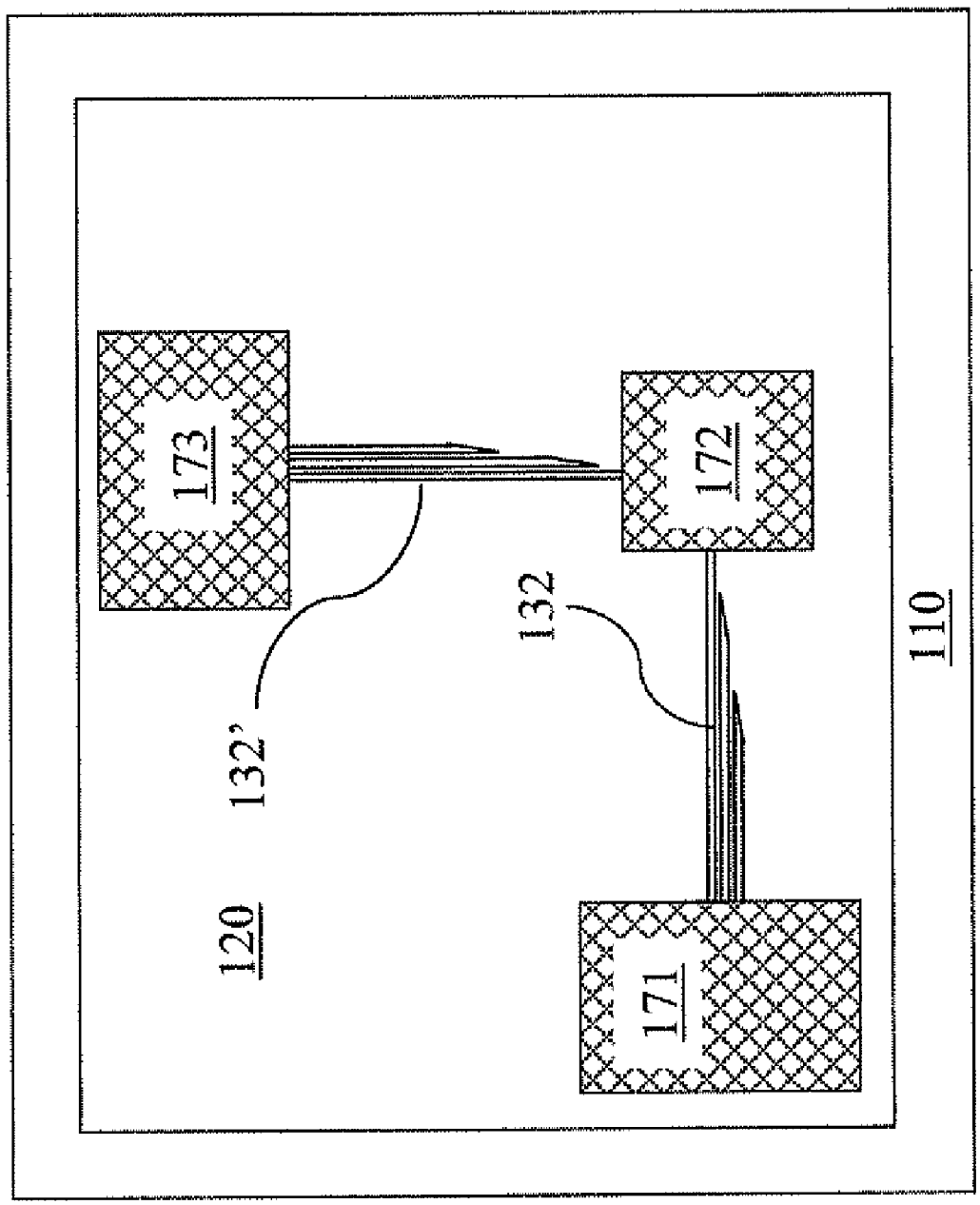
FIG. 8 is a second exemplary structure according to the first embodiment of the present invention.

Referring to FIG. 8, a second exemplary structure according to the present invention comprises the components of the first exemplary structure and at least another set of parallel conductive lines 132' and at least another electrode 172. Multiple sets of parallel conductive lines (132, 132') and multiple electrodes (171, 172, 173) are employed to form a semiconductor structure as a patterned array of electrical fuses or resistors.

Figure 9A:
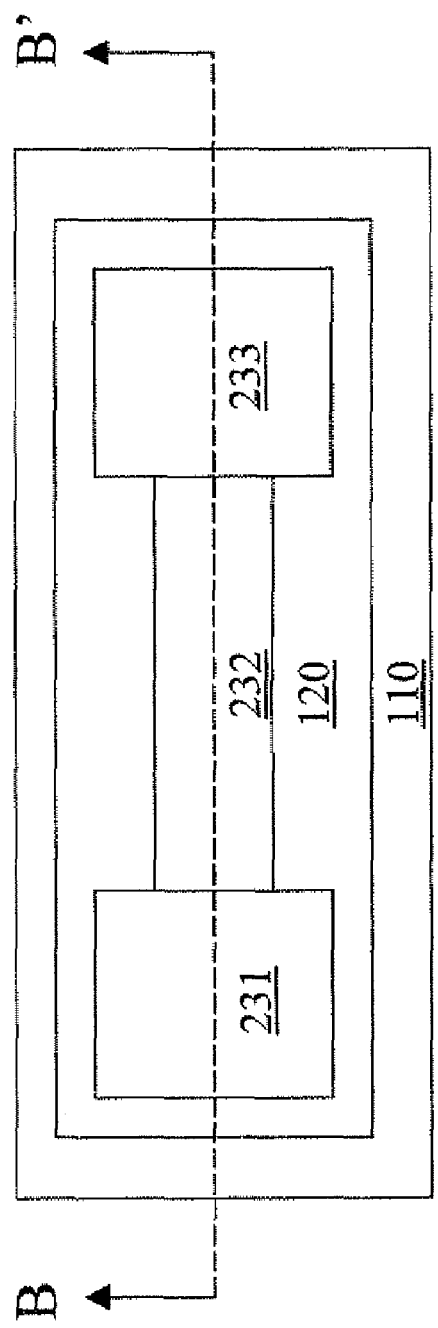
FIGS. 9A-15B are sequential views of a third exemplary structure according to a second embodiment of the present invention. The same figure labeling conventions apply as FIGS. 1A-7B.
Figure 9B:
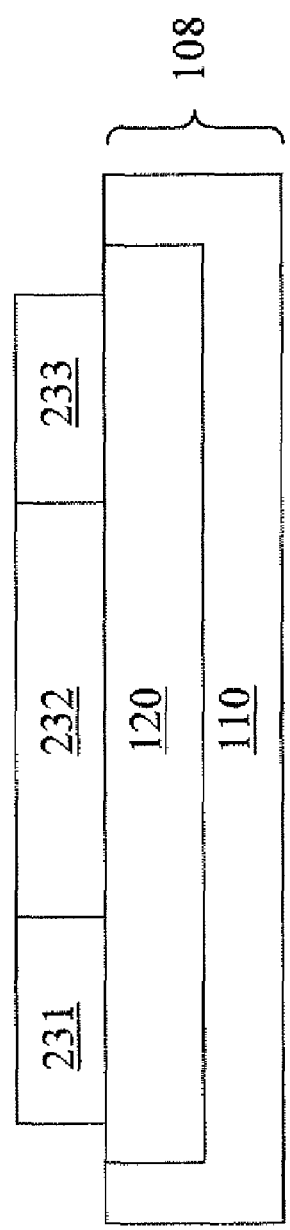

Referring to FIGS. 9A and 9B, a third exemplary structure according to a third embodiment of the present invention is shown, which comprises a semiconductor substrate 108 containing a substrate layer 110 and a shallow trench isolation 120 comprising a dielectric material as in the first embodiment of the present invention. A first electrode 231, a second electrode 233, and a link portion 232, each of which comprising a conductive material, is formed on the shallow trench isolation 120. The first electrode 231, the second electrode 232, and the link portion 232 may comprise a semiconductor material, a metal, and/or a metal semiconductor alloy. The link portion may be substantially rectangular having a length in the direction connecting the first electrode 231 and the second electrode 232 and a width perpendicular to the direction of the length. The width may be a lithographic minimum dimension or may be greater than a lithographic minimum dimension. In one case, the first electrode 231, the second electrode 232, and the link portion 232 may be an anode, a cathode, and a fuselink, respectively.

Figure 10A:
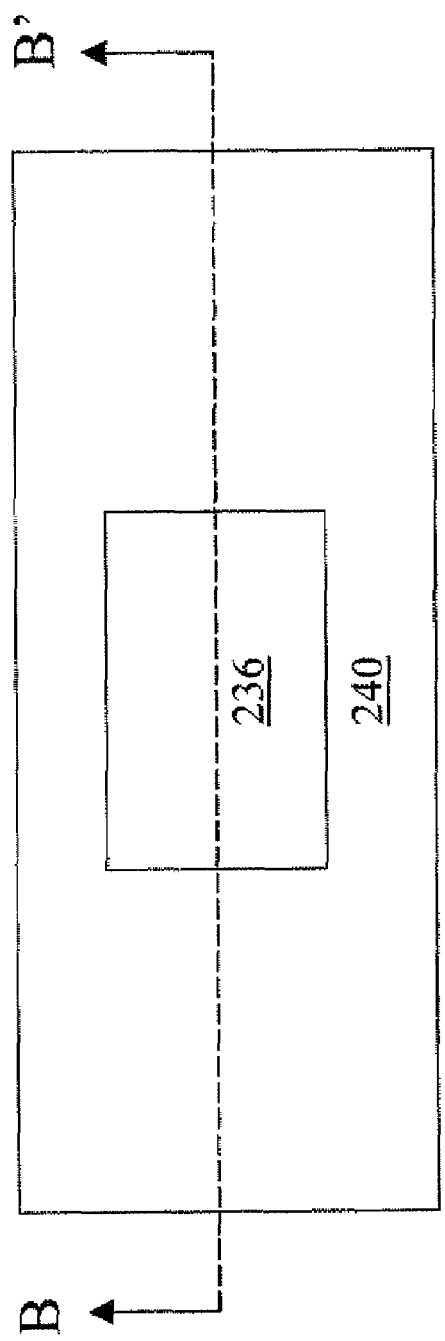
Figure 10B:
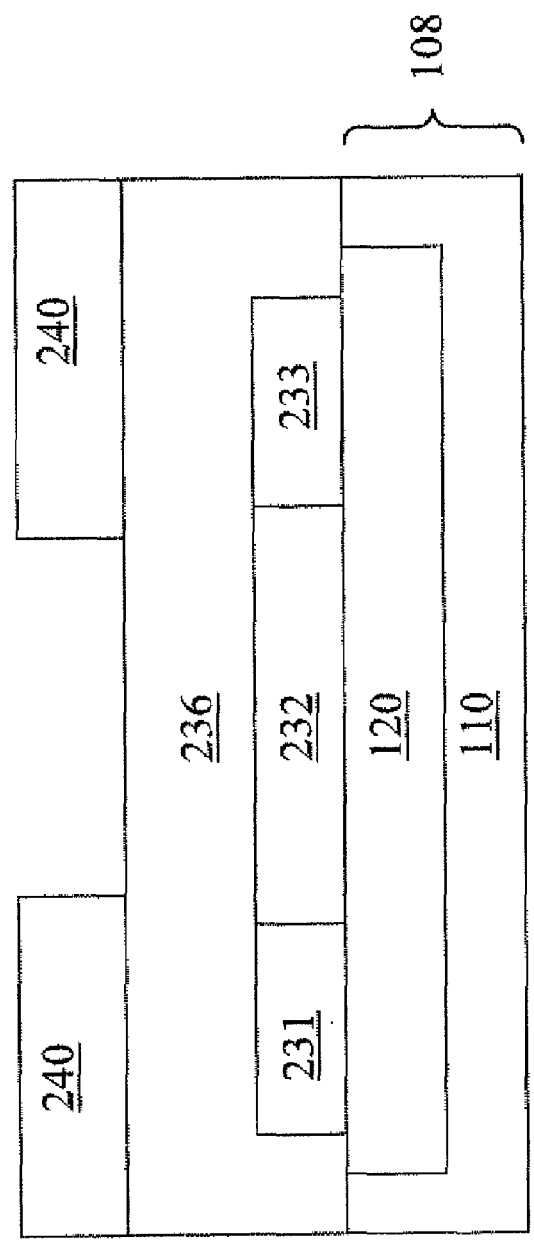

Referring to FIGS. 10A and 10B, a first insulator layer 236 is formed on the first electrode 231, the second electrode 233, and the link portion 232. The first insulator layer 236 may comprise an oxide or a nitride. For example, the first insulator layer 236 may be a silicon oxide. The thickness of the first insulator layer 236 may be from about 10 nm to about 200 nm, although lower and greater thicknesses are also contemplated.

A second insulator layer 240 is formed on the first insulator layer 236. The second dielectric layer 240 comprises a dielectric material such as an oxide or a nitride. For example, the second dielectric layer 240 may comprise silicon oxide. The second dielectric layer 240 has a thickness from about 30 nm to about 300 nm. The second dielectric layer 240 is patterned to form a rectangular recessed area having a recessed area length and a recessed area width. The recessed area length is greater than the recessed area width. The direction of the recessed area length is parallel to the lengthwise direction of the link portion 232. The recessed area width is equal to or greater than a lithographic minimum dimension.

Figure 11A:
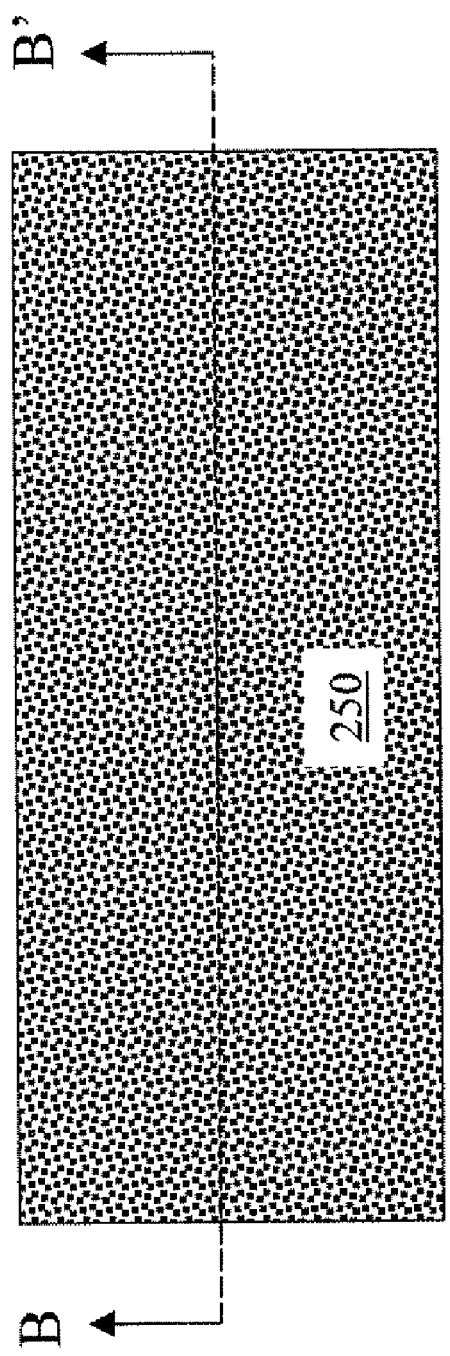
Figure 11B:
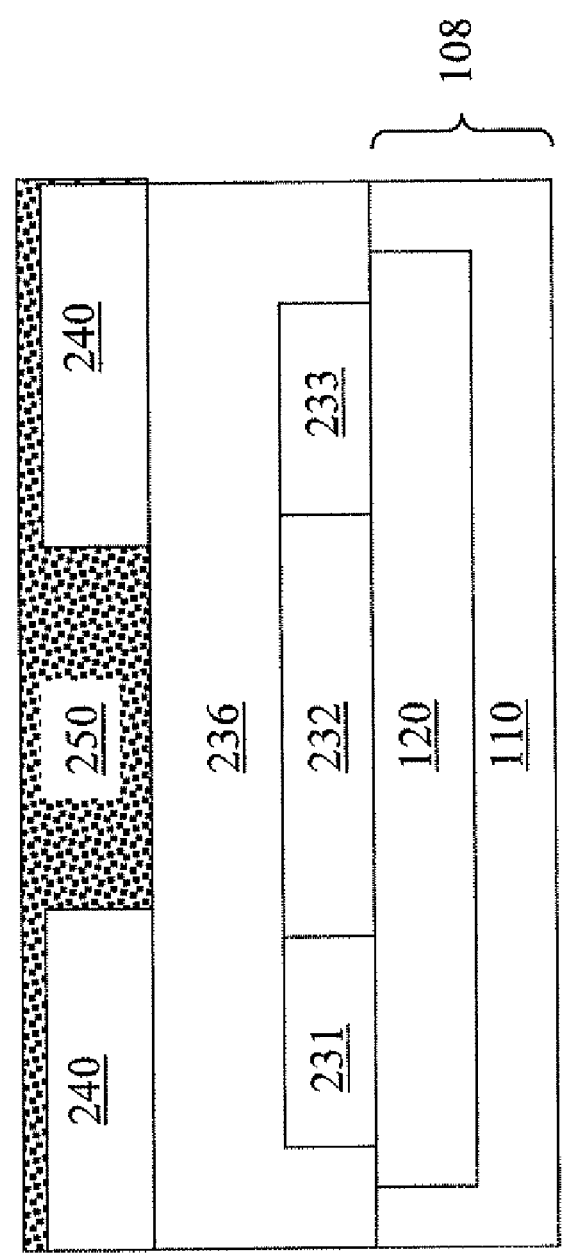

Referring to FIGS. 11A and 11B, a block copolymer layer 250 comprising self-assembling block copolymers that are capable of self-organizing into nanometer-scale patterns are applied over the third exemplary structure including the rectangular area. Self-assembling block copolymers as described in the first embodiment may be employed. The composition of the self-assembling block copolymers is selected so that upon annealing, the self-assembling block copolymers form lines of a first polymeric block component interspersed with lines of a second polymeric block component.

Figure 12A:
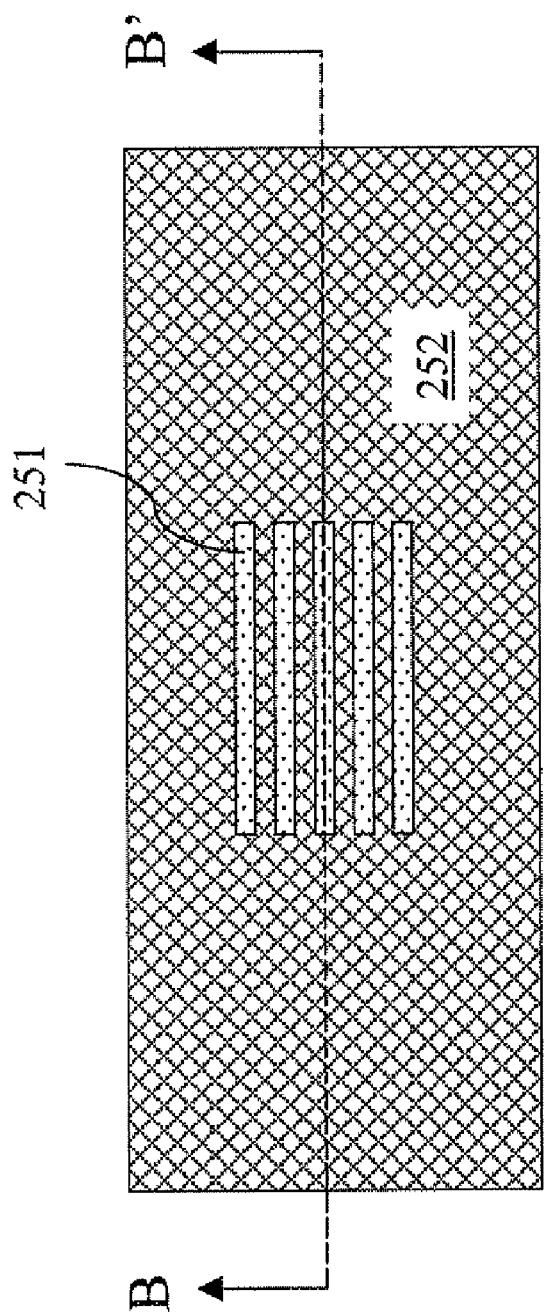
Figure 12B:
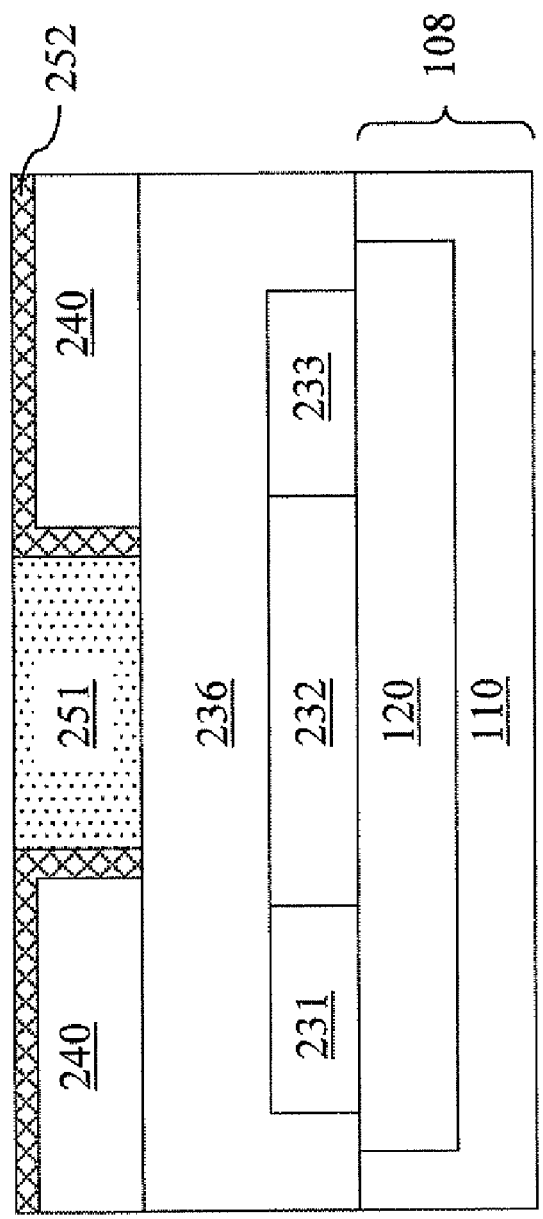

Referring to FIGS. 12A and 12B, the third exemplary semiconductor structure is annealed at an elevated temperature to form a set 251 of parallel polymer block lines containing the first polymeric block component within the rectangular recessed area. A second polymer block region 252 containing the second polymeric block component is formed between adjacent pairs of the first set 151 of parallel polymer block lines and outside the rectangular recessed area. The same annealing process may be employed as in the first embodiment of the present invention. Each of the first set 151 of parallel polymer block lines has a sublithographic width. Further, the pitch of the first set 151 of parallel polymer block lines is also sublithographic.

Figure 13A:
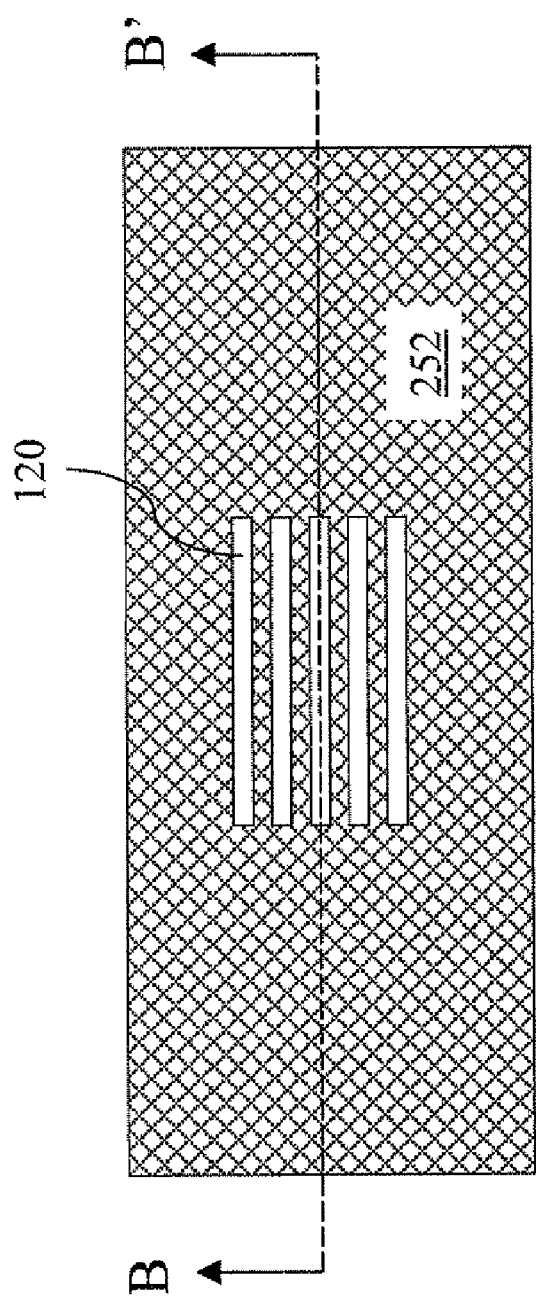
Figure 13B:
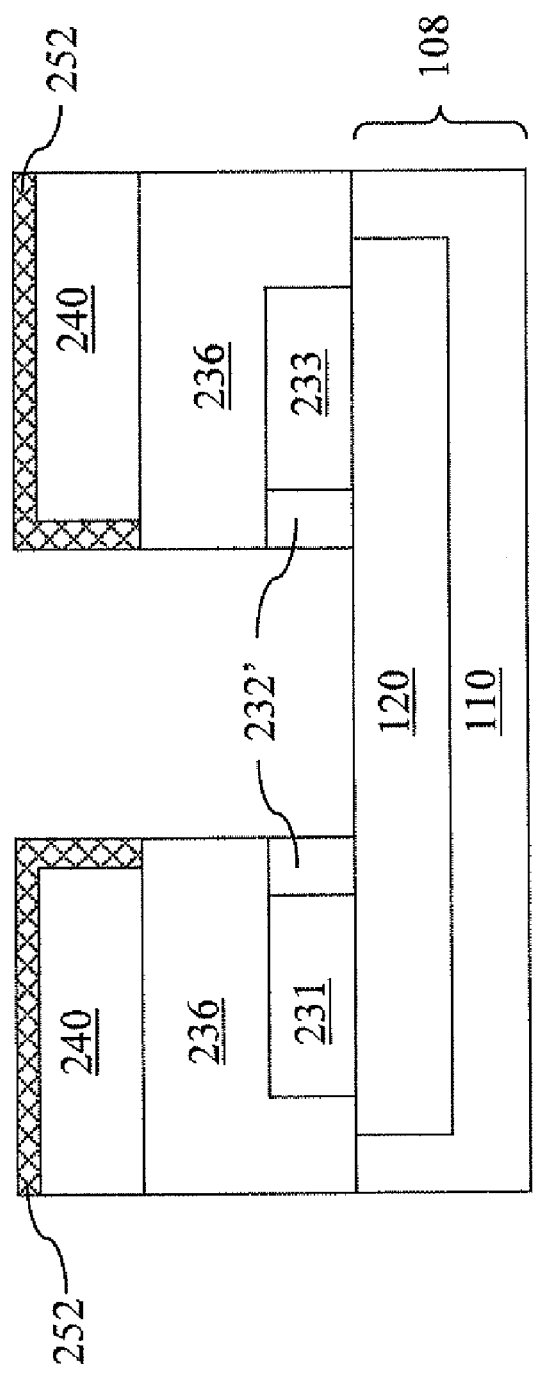

Referring to FIGS. 13A and 13B, the pattern formed by the set 251 of parallel polymer block lines is transferred by a reactive ion etch into the first insulator layer 236 and then into the link portion 232. The reactive ion etch removes the first polymeric block component and is selective to the second polymeric block component. Substantially rectangular holes corresponding to the set 251 of parallel polymer block lines are formed in the first insulator layer 236. The first insulator layer 236 has sidewalls that are substantially coincident with the boundaries of the second polymer block region 252. At least one substantially rectangular hole is formed in the link portion 232, which is hereafter referred to as a rectangular-holed link portion 232'.

Figure 14A:
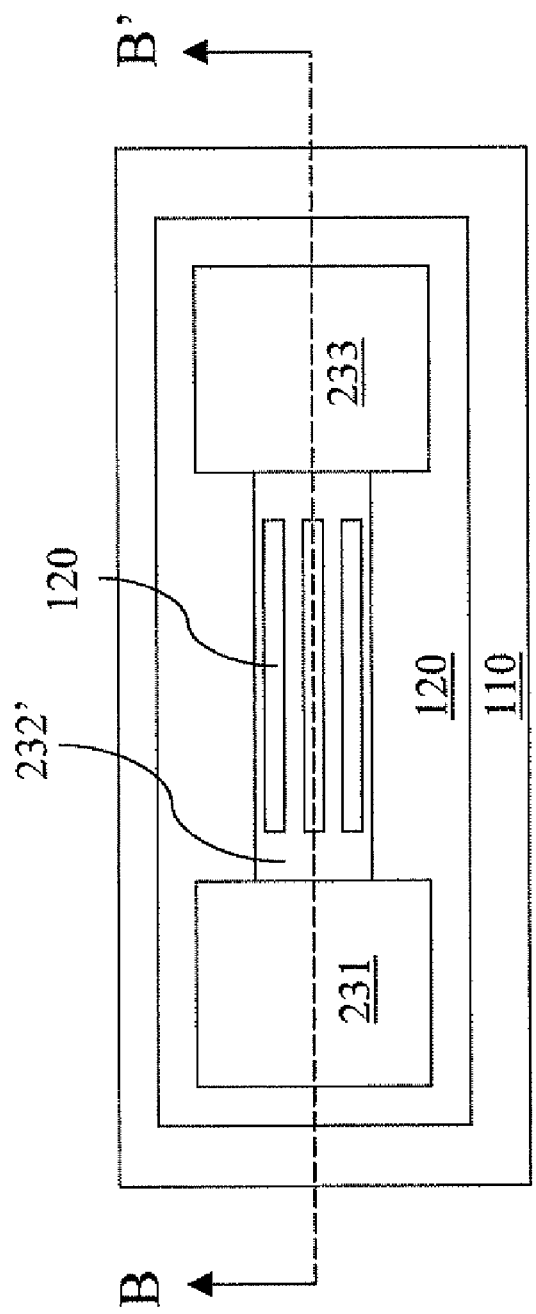
Figure 14B:
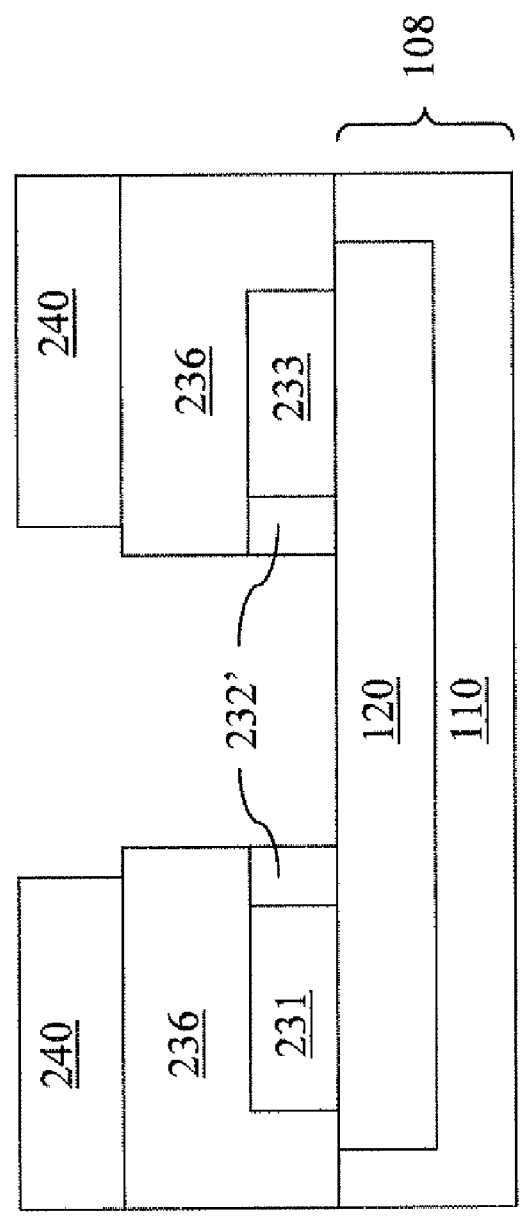

Referring to FIGS. 14A and 14B, the second polymer block region 252 is removed. At this step, the rectangular-holed link portion 232' comprises at least one rectangular hole having a sublithographic width in the direction perpendicular to the direction connecting the first electrode 231 and the second electrode 233. The at least one rectangular hole may be a plurality of rectangular holes having a sublithographic width in the direction perpendicular to the direction connecting the first electrode 231 and said second electrode 233. The plurality of rectangular holes may have a sublithographic spacing between each adjacent pair of rectangular holes.

Figure 15A:
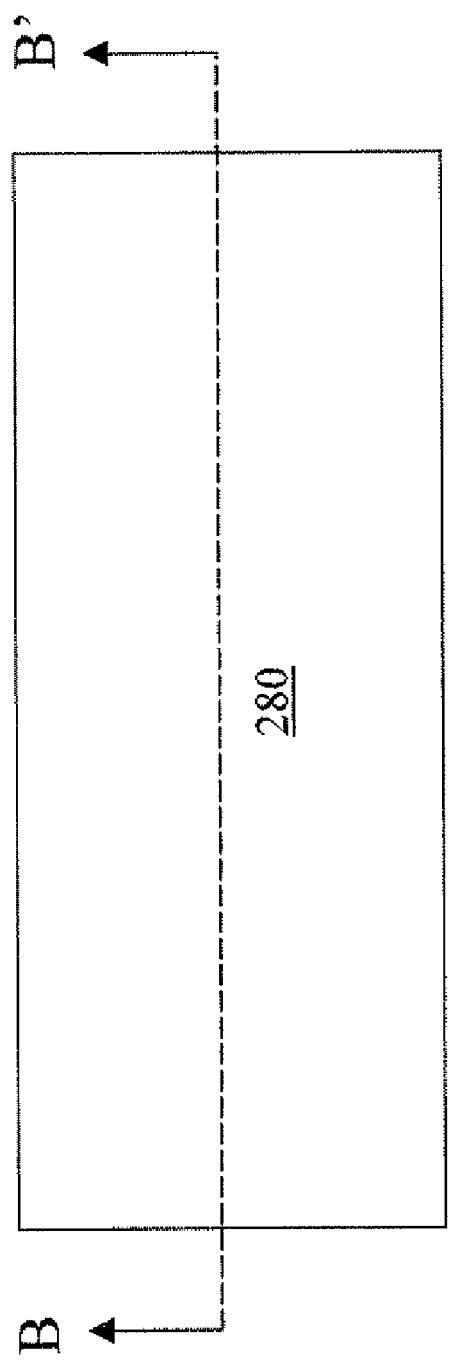
Figure 15B:
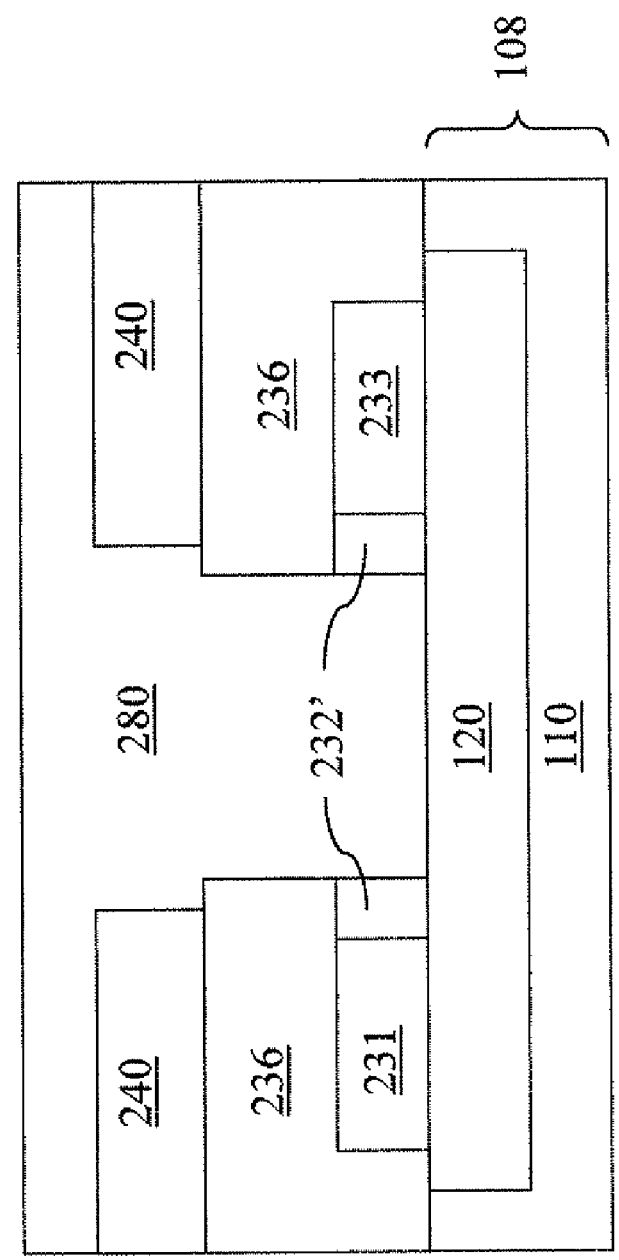

Referring to FIGS. 15A and 15B, a third insulator layer 280 is formed in the at least one substantially rectangular hole in the rectangular-holed link portion 232' and the substantially rectangular holes in the first insulator layer 236. Thus, the third exemplary semiconductor structure comprising the first electrode 231, the second electrode 233, and the rectangular-holed link portion 232' is separated from back-end-of-line metal wiring. The third semiconductor structure may be planarized as necessary and contact vias may be formed through the first, second, and/or third insulator layers (236, 240, 280) to wire the third exemplary semiconductor structure.

Figure 16A:
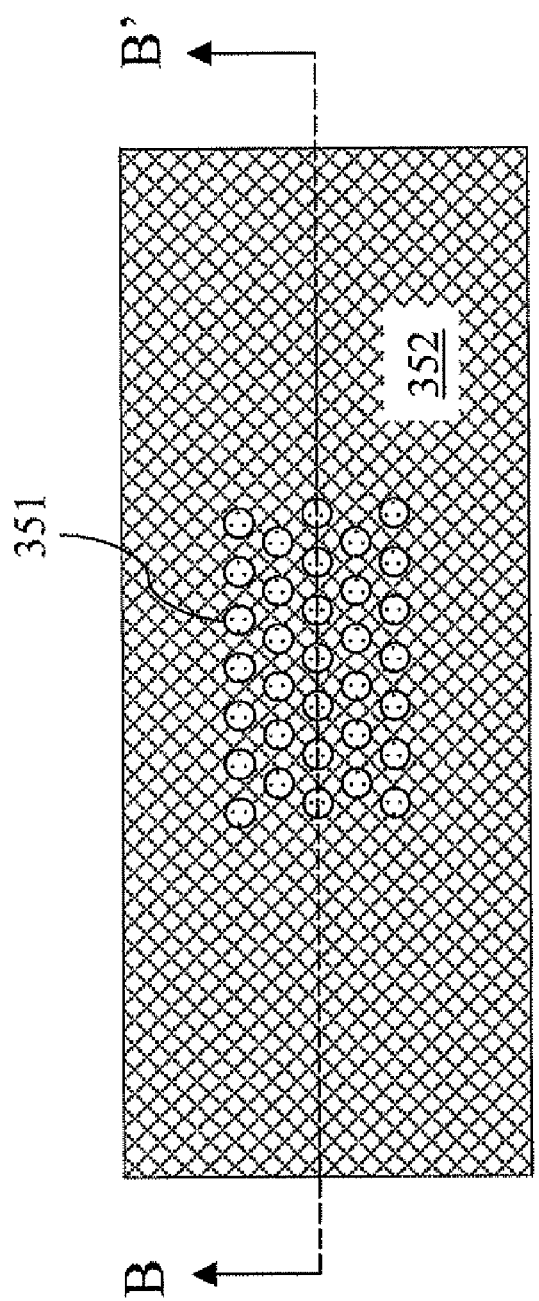
Figure 16B:
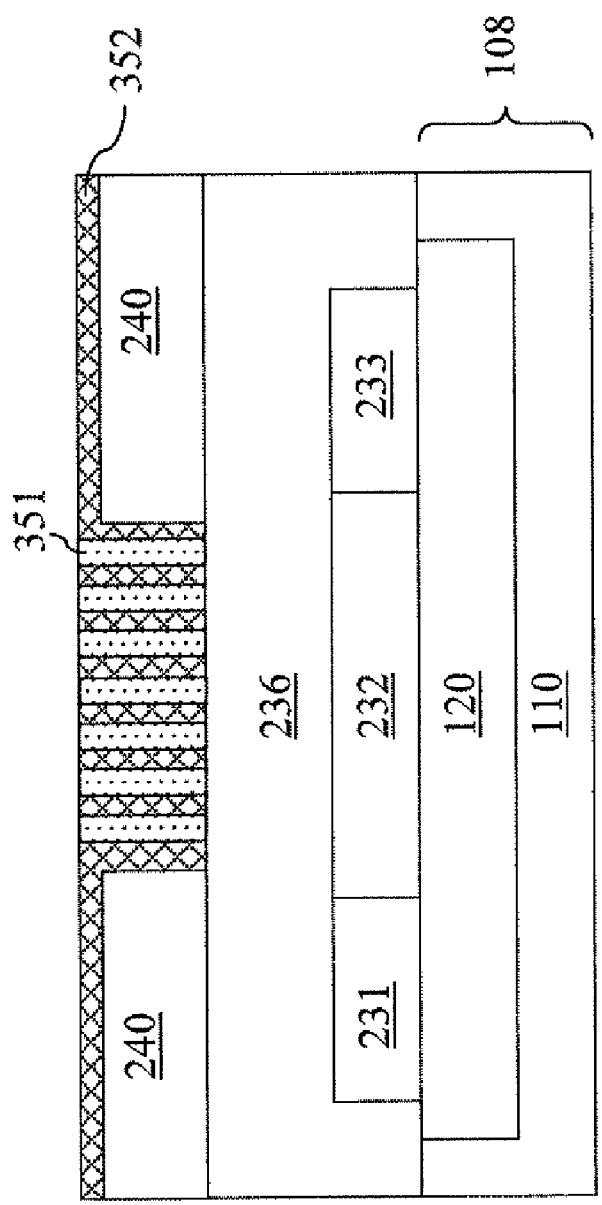

Referring to FIGS. 16A and 16B, a fourth exemplary structure according to a fourth embodiment of the present invention is shown, which may be derived from the third exemplary structure shown in FIGS. 11A and 11B. Self-assembling block copolymers as described in the first embodiment may be employed. Unlike the third embodiment, however, the composition of the self-assembling block copolymers is selected so that upon annealing, the self-assembling block copolymers form columnar structures, i.e., a plurality of cylinders comprising a first polymeric block component, or a plurality of "first polymeric block component cylinders" 351, that are embedded in a second polymeric block component layer 352 comprising a second polymeric block component.

Each of the first polymeric block component cylinders 351 has a sublithographic diameter, i.e., a diameter smaller than a lithographic minimum dimension of a lithography tool. The first polymeric block component cylinders 351 may be arranged in a honeycomb pattern. The distance between an adjacent pair of the first polymeric block component cylinders 351 may also be sublithographic.

Figure 17A:
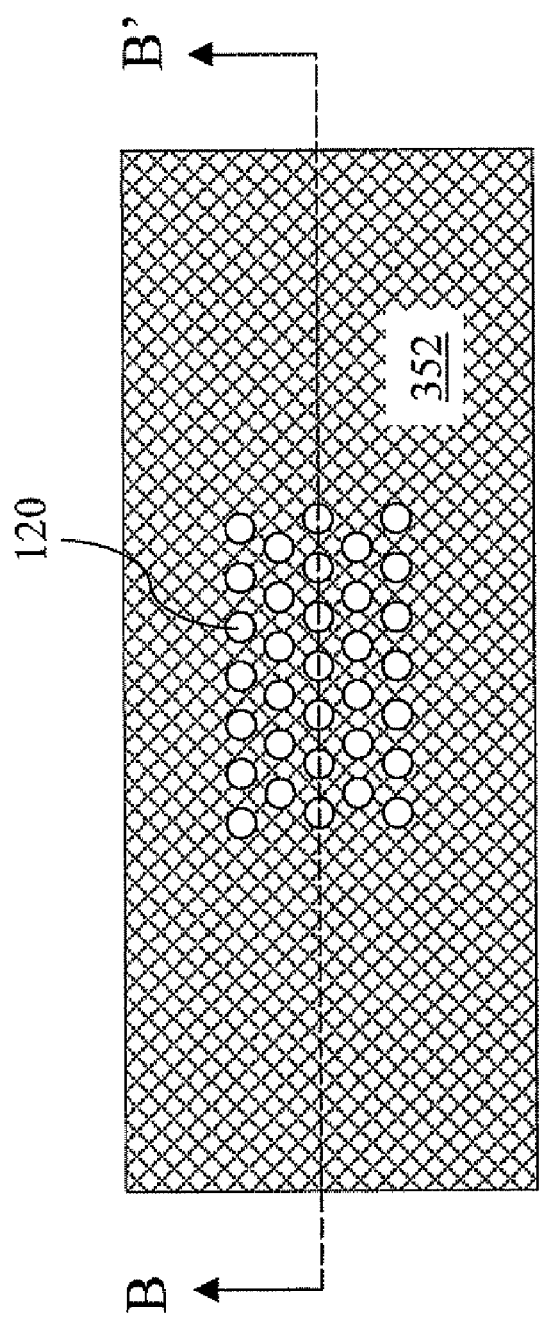
Figure 17B:
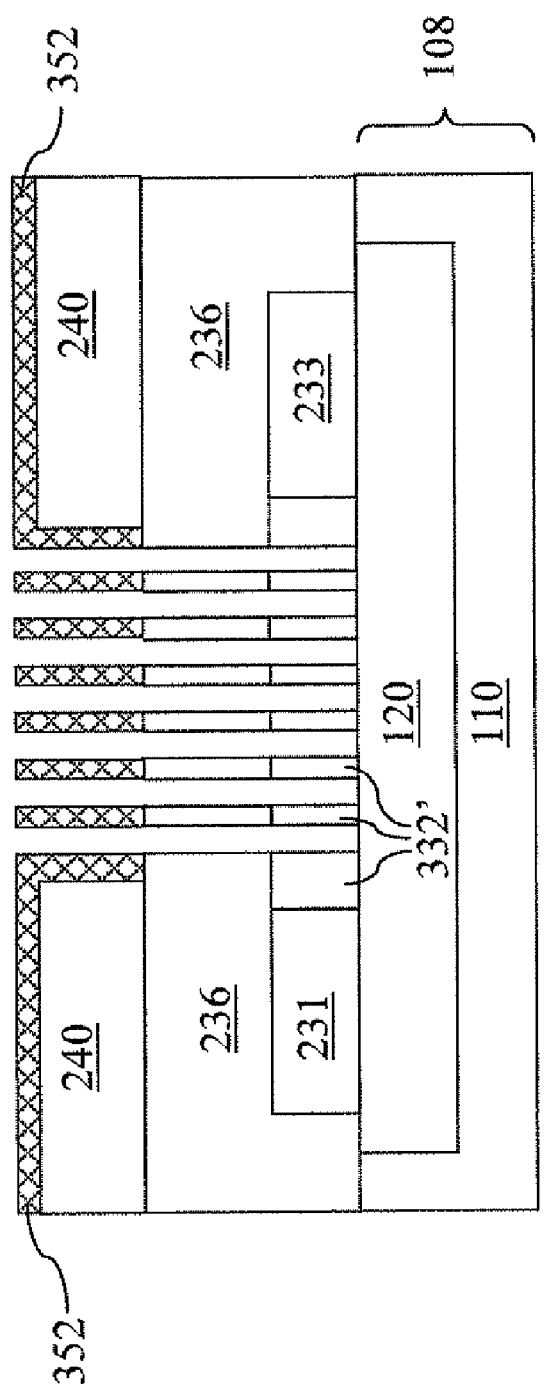

Referring to FIGS. 17A and 17B, the pattern formed by the first polymeric block component cylinders 351 is transferred by a reactive ion etch into the first insulator layer 236 and then into the link portion 232. The reactive ion etch removes the first polymeric block component and is selective to the second polymeric block component. Substantially cylindrical holes corresponding to the first polymeric block component cylinders 351 are formed in the first insulator layer 236. The first insulator layer 236 has sidewalls that are substantially coincident with the cylindrical walls of the second polymeric block component layer 352. At least one substantially cylindrical hole is formed in the link portion 232, which is hereafter referred to as a cylindrical-holed link portion 332'.

Referring to FIGS. 18A and 18B, the second polymeric block component layer 352 is removed. At this step, the cylindrical-holed link portion 332' comprises at least one substantially cylindrical hole having a sublithographic diameter. The at least one substantially cylindrical hole may be a plurality of substantially cylindrical holes having a sublithographic diameter. The plurality of substantially cylindrical holes may be arranged in a honeycomb pattern, in which the distance between the center axes of an adjacent pair of substantially cylindrical holes may also be sublithographic.

Referring to FIGS. 19A and 19B, a third insulator layer 280 is formed in the at least one substantially cylindrical hole in the cylindrical-holed link portion 332' and the substantially cylindrical holes in the first insulator layer 236. Thus, the fourth exemplary semiconductor structure comprising the first electrode 231, the second electrode 233, and the cylindrical-holed link portion 332' is separated from back-end-of-line metal wiring. The fourth semiconductor structure may be planarized as necessary and contact vias may be formed through the first, second, and/or third insulator layers (236, 240, 280) to wire the fourth exemplary semiconductor structure.

Figure 20A:
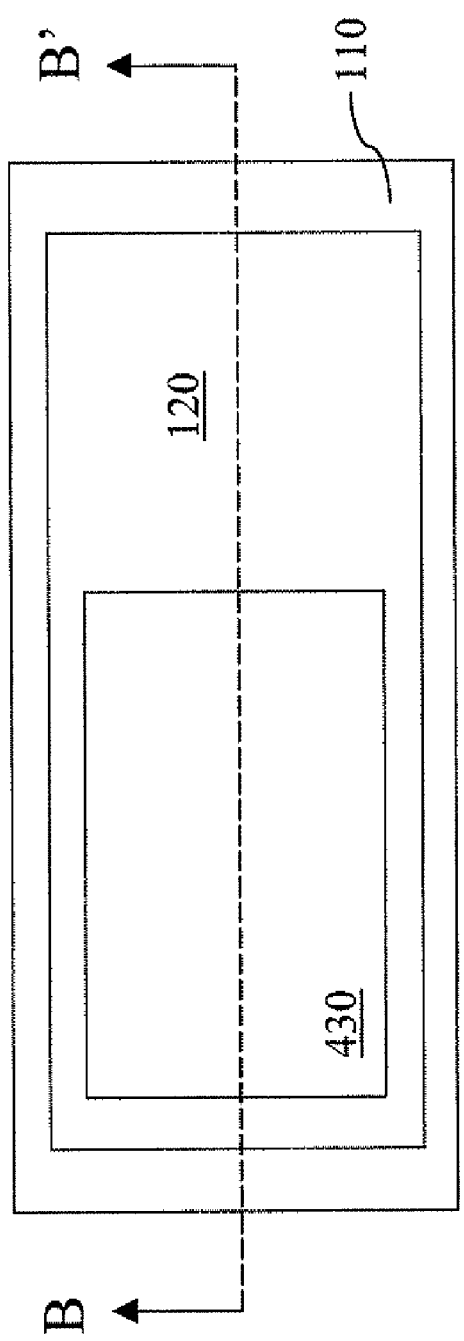
Figure 20B:
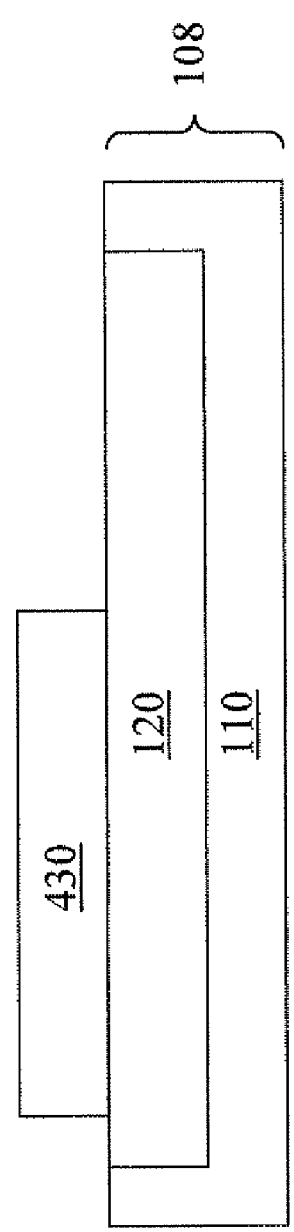

Referring to FIGS. 20A and 20B, a fifth exemplary structure according to a fifth embodiment of the present invention is shown, which comprises a semiconductor substrate 108 containing a substrate layer 110 and a shallow trench isolation 120 comprising a dielectric material as in the first embodiment of the present invention. A bottom electrode 430 is formed on the semiconductor substrate 108, for example, by deposition of a conductive layer and lithographic patterning and reactive ion etch. The bottom electrode 430 may be elliptical or polygonal. The bottom electrode 430 may comprise a semiconductor material, a metal, and/or a metal semiconductor alloy.

Referring to FIGS. 21A and 21B, a first insulator layer 236 is formed on the first electrode 231, the second electrode 233, and the link portion 232. The first insulator layer 236 may comprise an oxide or a nitride. For example, the first insulator layer 236 may be a silicon oxide. The thickness of the first insulator layer 236 may be from about 10 nm to about 200 nm, although lesser and greater thicknesses are also contemplated.

A second insulator layer 240 is formed on the first insulator layer 236. The second dielectric layer 240 comprises a dielectric material such as an oxide or a nitride. For example, the second dielectric layer 240 may comprise silicon oxide. The second dielectric layer 240 has a thickness from about 30 nm to about 300 nm. The second dielectric layer 240 is patterned to form an elliptical or polygonal recessed area, which may be a circular recessed area having a diameter that may be equal to a lithographic minimum dimension, or may be greater than a lithographic minimum dimension.

Figure 22A:
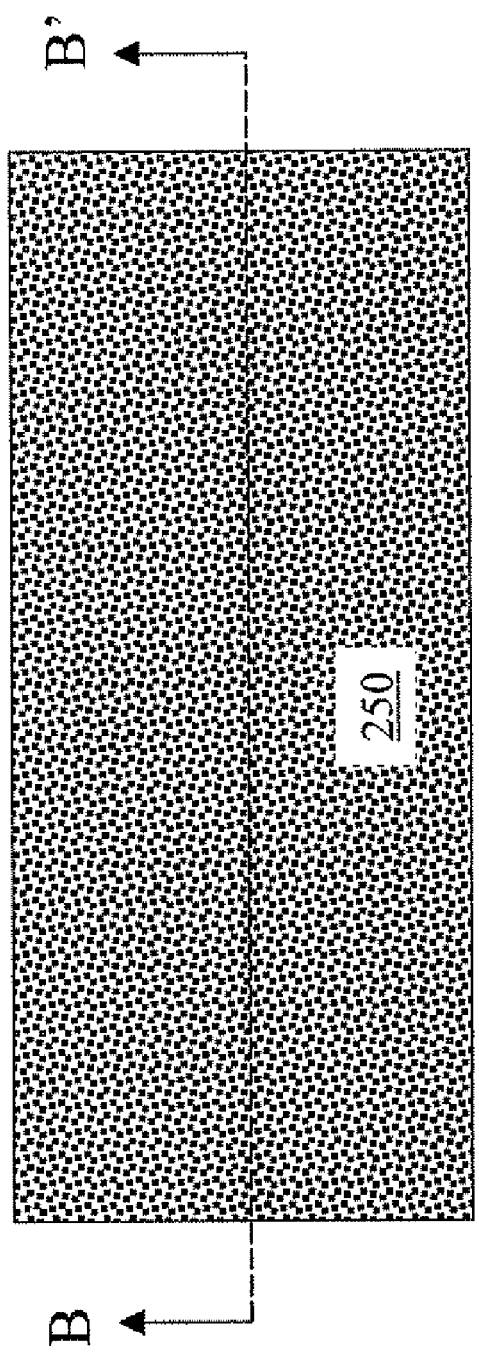
Figure 22B:
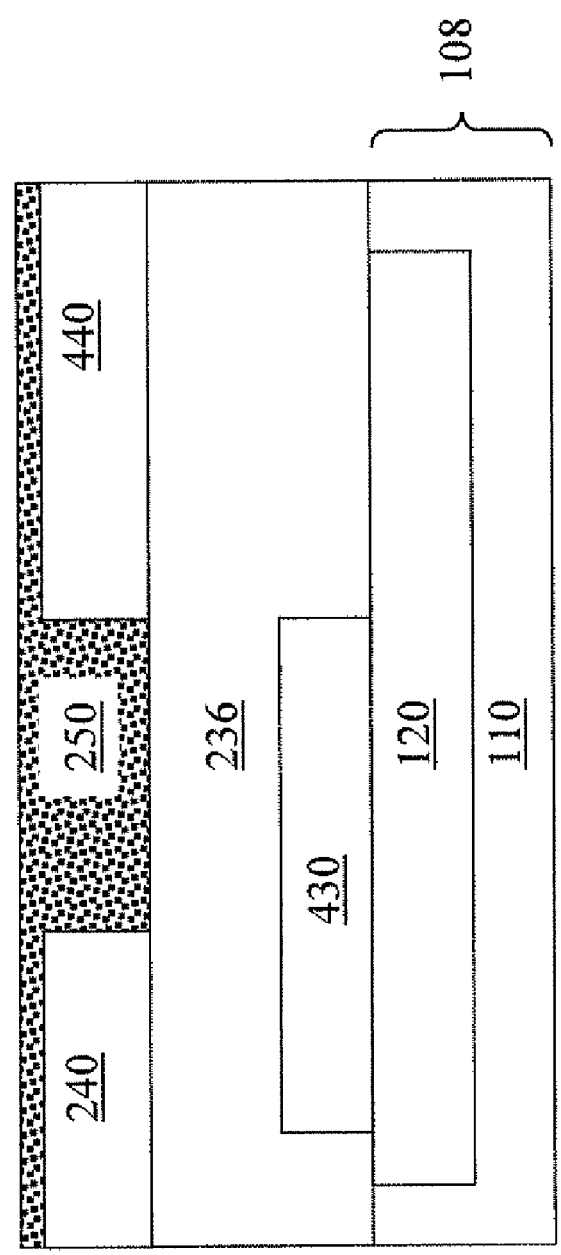

Referring to FIGS. 22A and 22B, self-assembling block copolymers as described in the first embodiment may be employed. As in the fourth embodiment, the composition of the self-assembling block copolymers is selected so that upon annealing, the self-assembling block copolymers form columnar structures.

Figure 23A:
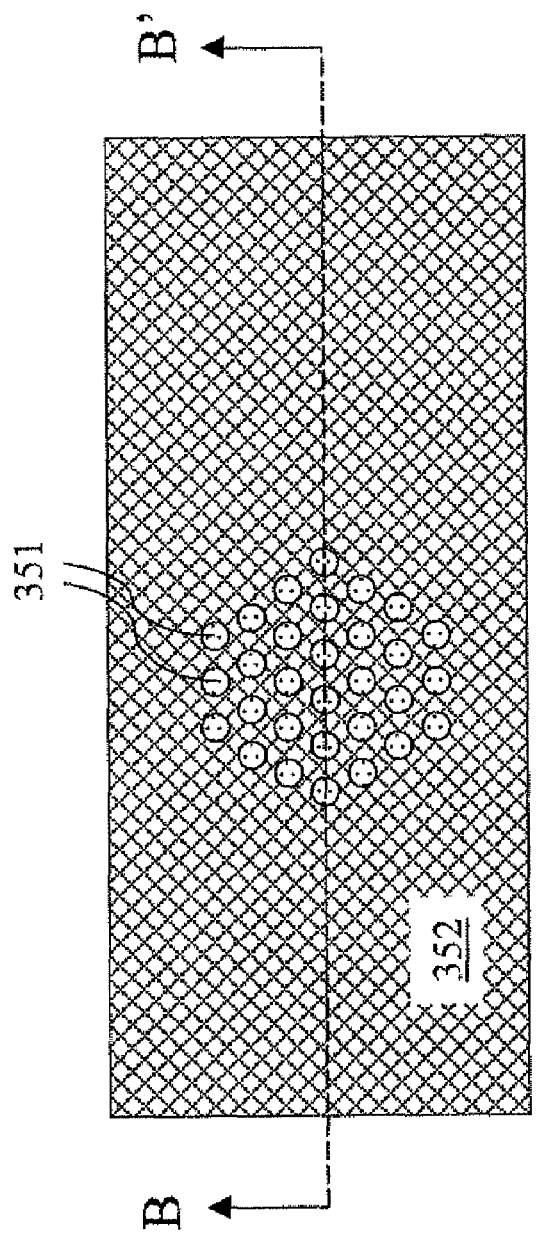
Figure 23B:
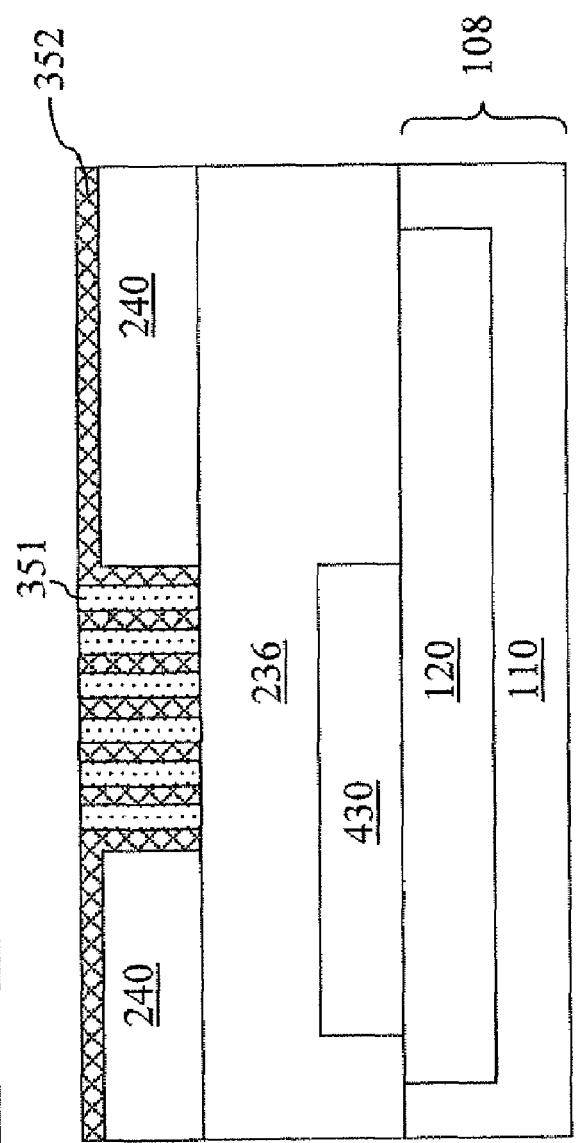

Referring to FIGS. 23A and 23B, the self-assembling block copolymers are annealed to form a plurality of first polymeric block component cylinders 351 that are embedded in a second polymeric block component layer 352 comprising a second polymeric block component. Each of the first polymeric block component cylinders 351 has a sublithographic diameter, i.e., a diameter smaller than a lithographic minimum dimension of a lithography tool. The first polymeric block component cylinders 351 may be arranged in a honeycomb pattern. The distance between an adjacent pair of the first polymeric block component cylinders 351 may also be sublithographic.

Figure 24A:
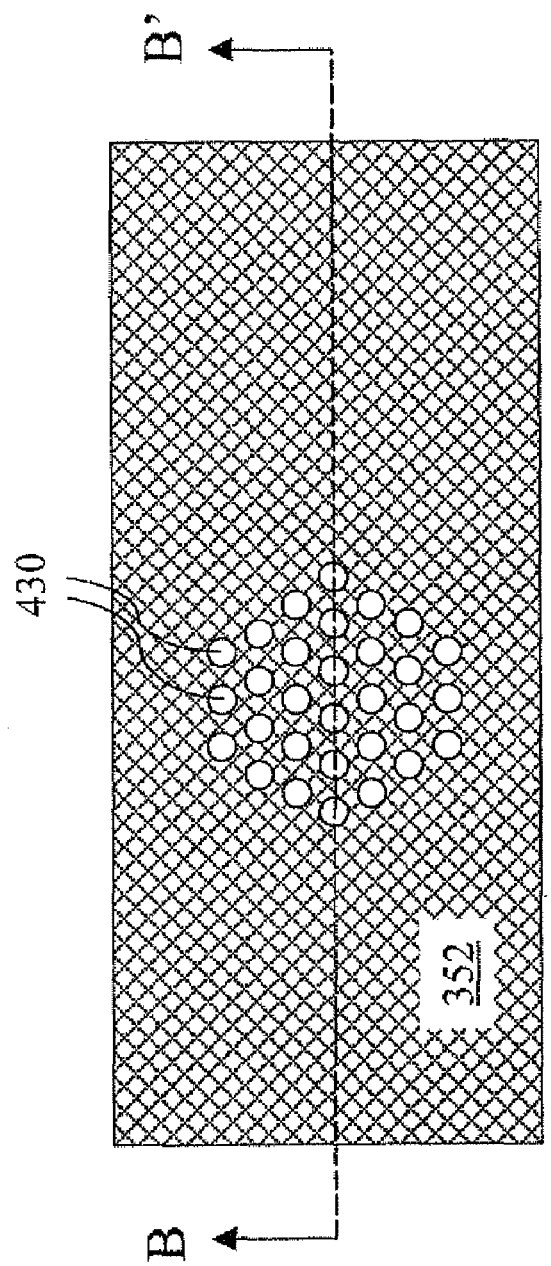
Figure 24B:
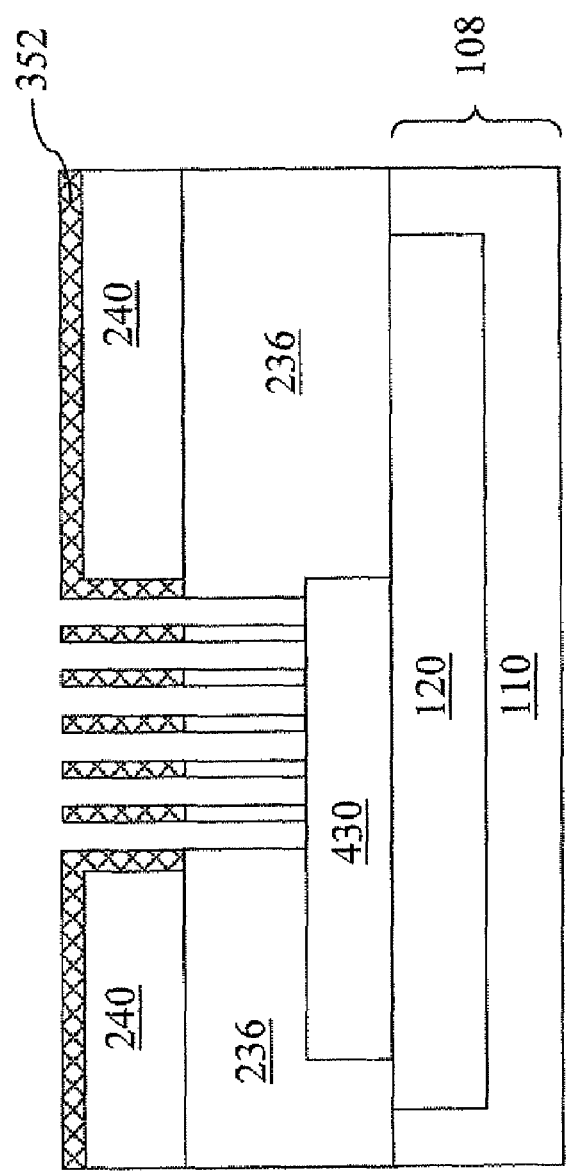

Referring to FIGS. 24A and 24B, the pattern formed by the first polymeric block component cylinders 351 is transferred by a reactive ion etch into the first insulator layer 236 and then into the link portion 232. The reactive ion etch removes the first polymeric block component and is selective to the second polymeric block component. Substantially cylindrical holes corresponding to the first polymeric block component cylinders 351 are formed in the first insulator layer 236. The first insulator layer 236 has sidewalls that are substantially coincident with the cylindrical walls of the second polymeric block component layer 352. The reactive ion etch is preferably selective to the bottom electrode 430.

Figure 25A:
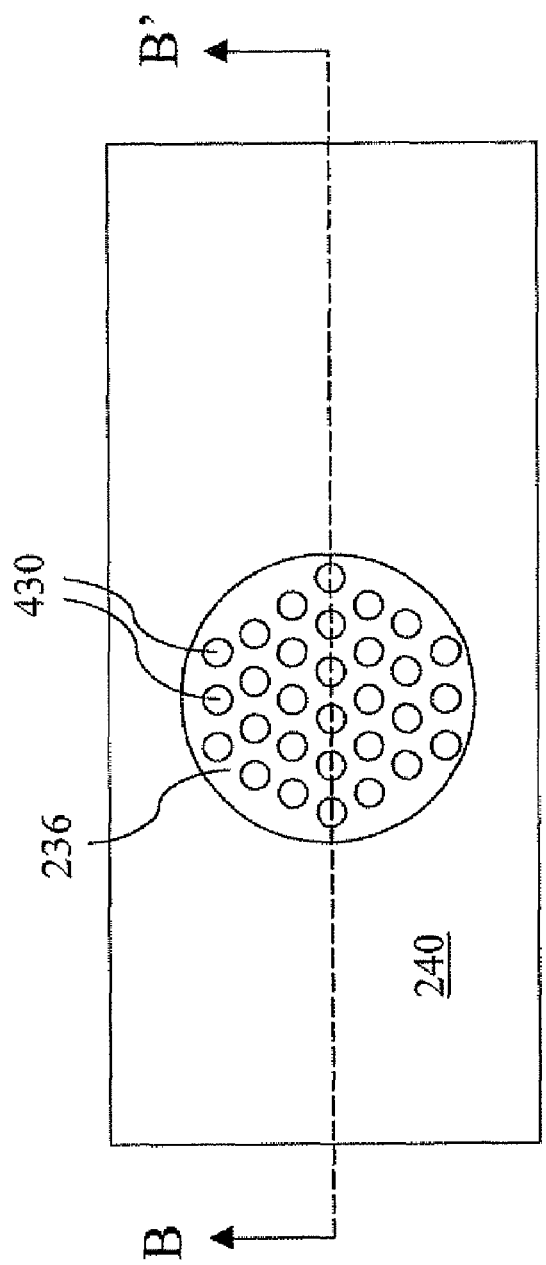
Figure 25B:
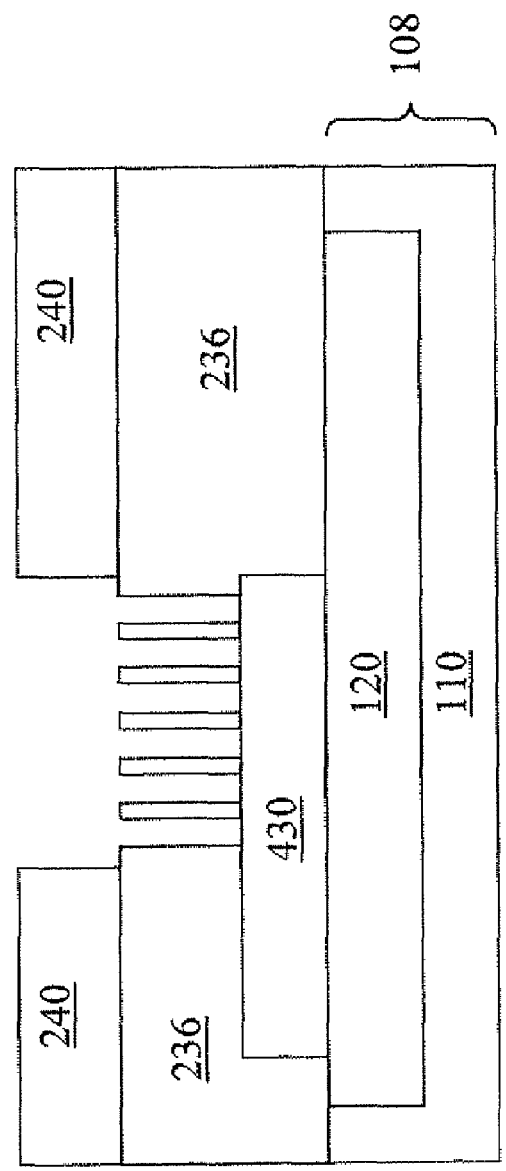

Referring to FIGS. 25A and 25B, the second polymeric block component layer 352 is removed. At this step, the first insulator layer 236 comprises a plurality of substantially cylindrical holes having a sublithographic diameter. The plurality of substantially cylindrical holes may be arranged in a honeycomb pattern, in which the distance between the center axes of an adjacent pair of substantially cylindrical holes may also be sublithographic.

Referring to FIGS. 26A and 26B, a conductive material is deposited in the plurality of substantially cylindrical holes in the first insulator layer 236 and in the recessed area in the second insulator layer 240. A plurality of sublithographic vertical cylindrical links 490B vertically abutting the bottom electrode 430 is formed in the plurality of substantially cylindrical holes in the first insulator layer 236. A top electrode 490A vertically abutting each of the plurality of sublithographic vertical cylindrical links 490B is formed in the recessed area in the second insulator layer 236. The top electrode 490A may be planarized as needed.

Thus, the fifth exemplary semiconductor structure comprising the bottom electrode 430, the plurality of sublithographic vertical cylindrical links 490B, and the top electrode 490A. The bottom electrode 430 and the top electrode 490A are located at two different levels, i.e., the bottom surface of the bottom electrode 430 and the bottom surface of the top electrode 490A have different heights. The plurality of sublithographic vertical cylindrical links 490B and the top electrode 490A comprise the same conductive material, which may be a semiconductor, a metal, and/or a metal semiconductor alloy. The bottom electrode 430 and the top electrode 490A may, or may not, comprise the same material.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
a shallow trench isolation comprising a dielectric material and located in a semiconductor substrate;
a plurality of parallel conductive lines having a width of a first sublithographic dimension and located on said semiconductor substrate, wherein each of said plurality of conductive lines has a pair of sidewall surfaces that are parallel to a first vertical plane that is orthogonal to a top surface of said semiconductor substrate, wherein each adjacent pair of said parallel conductive lines is separated by a second sublithographic dimension, and wherein multiple edges of said plurality of parallel conductive lines are located substantially on a second vertical plane that is orthogonal to said top surface of said semiconductor substrate and located at a non-orthogonal angle from said first vertical plane, each of said multiple edges being directly adjoined to one of said pairs of sidewall surfaces;
a first electrode contacting all of said plurality of parallel conductive lines; and
a second electrode contacting only one of said plurality of parallel conductive lines.

2. The semiconductor structure of claim 1, wherein said plurality of parallel conductive lines comprises a semiconductor material.

3. The semiconductor structure of claim 1, wherein said plurality of parallel conductive lines comprises a metal or a metal semiconductor alloy.

4. The semiconductor structure of claim 1, wherein edges of said plurality of parallel conductive lines are located substantially on the same line located at a non-orthogonal angle from the direction of said parallel conductive lines.

5. The semiconductor structure of claim 1, wherein said second electrode contacts only one of said plurality of parallel conductive lines.

6. The semiconductor structure of claim 1, wherein the entirety of bottom surfaces of said plurality of parallel conductive lines, said first electrode, and said second electrode abut a top surface of said shallow trench isolation.

* * * * *